(12) United States Patent
Merka et al.

(10) Patent No.: US 11,117,412 B2
(45) Date of Patent: Sep. 14, 2021

(54) LITHOGRAPHIC PRINTING PLATE PRECURSORS AND METHOD OF USE

(71) Applicant: Eastman Kodak Company, Rochester, NY (US)

(72) Inventors: Oliver Merka, Gottingen (DE); Stephanie Mueller, Clausthal-Zellerfeld (DE); Jan-Phillip Kemmling, Bilshausen (DE); Oliver Richard Blum, Bovenden (DE)

(73) Assignee: EASTMAN KODAK COMPANY, Rochester, NY (US)

( * ) Notice: Subject to any disclaimer, the term of this patent is extended or adjusted under 35 U.S.C. 154(b) by 120 days.

(21) Appl. No.: 16/589,240

(22) Filed: Oct. 1, 2019

(65) Prior Publication Data

US 2021/0094336 A1 Apr. 1, 2021

(51) Int. Cl.
*B41N 1/08* (2006.01)
*B41N 3/03* (2006.01)
(Continued)

(52) U.S. Cl.
CPC ............ *B41N 1/083* (2013.01); *B41C 1/1008* (2013.01); *B41N 3/034* (2013.01); *B41N 3/036* (2013.01); *C25D 11/12* (2013.01); *B41C 2210/04* (2013.01)

(58) Field of Classification Search
None
See application file for complete search history.

(56) References Cited

U.S. PATENT DOCUMENTS

| 4,566,952 A | 1/1986 | Sprintschnik et al. |
| 4,865,951 A | 9/1989 | Huddleston et al. |

(Continued)

FOREIGN PATENT DOCUMENTS

| EP | 2 481 604 A1 | 8/2012 |
| EP | 2 353 882 B1 | 3/2013 |

(Continued)

*Primary Examiner* — Joshua D Zimmerman

(57) ABSTRACT

Lithographic printing plate precursors are prepared with a unique aluminum-containing substrate and one or more radiation-sensitive imageable layers. The aluminum-containing substrate is prepared by three separate and sequential anodizing processes to provide an inner aluminum oxide layer having an average dry thickness ($T_i$) of 500-1,500 nm and a multiplicity of inner pores having an average inner pore diameter ($D_i$) larger than 0 and <15 nm. A formed middle aluminum oxide layer has a dry thickness ($T_m$) of 60-300 nm and a multiplicity of middle pores of average middle pore diameter ($D_m$) of 15-60 nm, arranged over the inner aluminum oxide layer. A formed outer aluminum oxide layer comprises a multiplicity of outer pores having an average outer pore diameter ($D_o$) of 5-35 nm and an average dry thickness ($T_o$) of 30-150 nm, arranged over the middle aluminum oxide layer. $D_m$ is larger than $D_o$ that is larger than $D_i$.

20 Claims, 1 Drawing Sheet

(51) Int. Cl.
*B41C 1/10* (2006.01)
*C25D 11/12* (2006.01)

(56) References Cited

U.S. PATENT DOCUMENTS

| | | | |
|---|---|---|---|
| 8,783,179 | B2 | 7/2014 | Kurokawa et al. |
| 8,789,464 | B2 | 7/2014 | Tagawa et al. |
| 8,978,555 | B2 | 3/2015 | Kurokawa et al. |
| 9,259,954 | B2 | 2/2016 | Tagawa et al. |
| 2006/0070881 | A1 | 4/2006 | Takada |
| 2008/0003411 | A1 | 1/2008 | Hunter et al. |
| 2011/0265673 | A1 | 11/2011 | Tagawa et al. |
| 2012/0192742 | A1 | 8/2012 | Kurokawa et al. |
| 2013/0052582 | A1 | 2/2013 | Hayashi |
| 2014/0047993 | A1 | 2/2014 | Hauck et al. |
| 2014/0326151 | A1 | 11/2014 | Namba et al. |
| 2015/0135979 | A1 | 5/2015 | Tagawa et al. |
| 2018/0250925 | A1 | 9/2018 | Merka et al. |
| 2019/0232703 | A1* | 8/2019 | Kudo ................. B41N 3/03 |

FOREIGN PATENT DOCUMENTS

| | | |
|---|---|---|
| JP | 2012 071435 A | 4/2012 |
| PW | 2018/160379 | 9/2018 |

\* cited by examiner

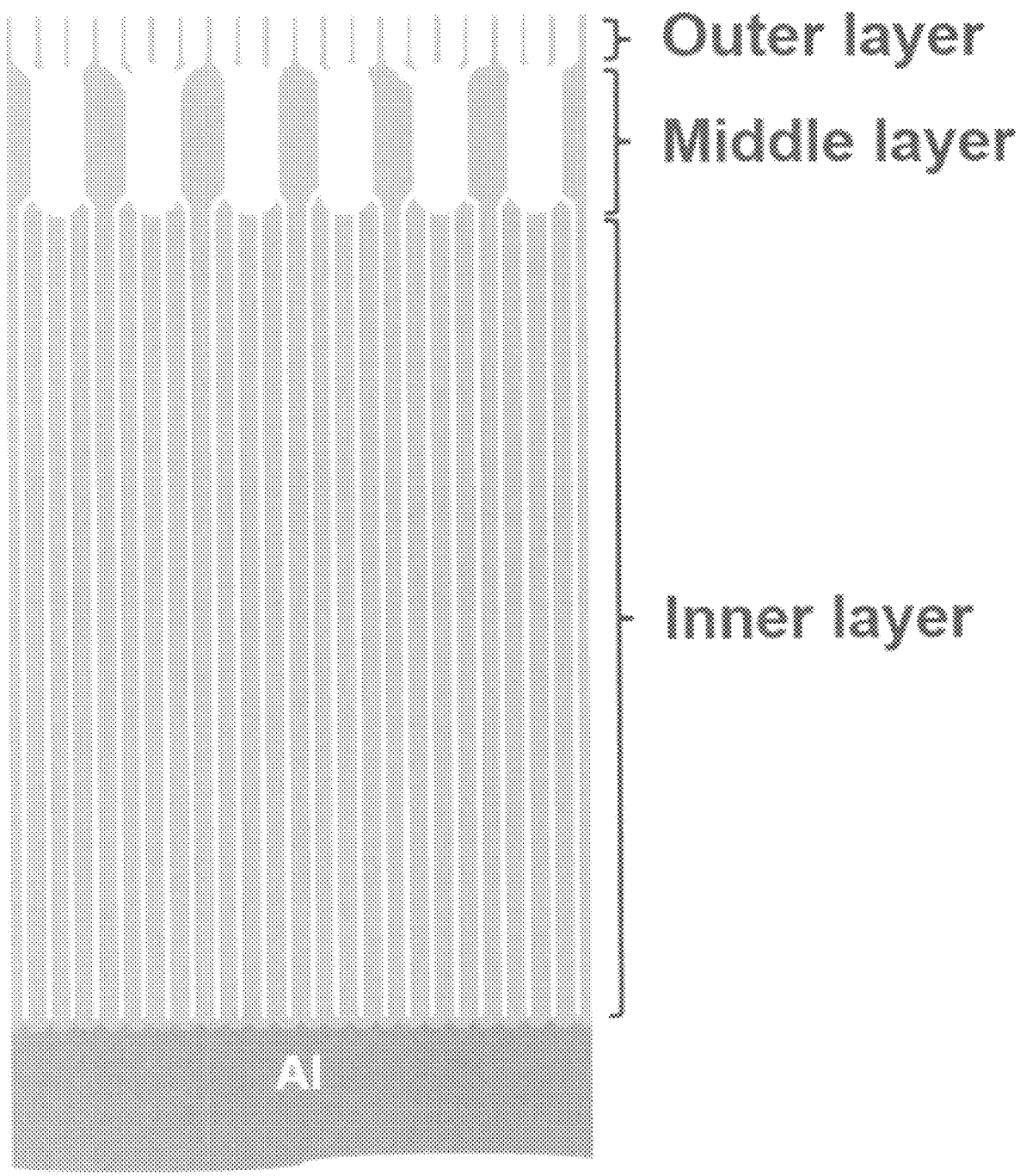

LITHOGRAPHIC PRINTING PLATE PRECURSORS AND METHOD OF USE

FIELD OF THE INVENTION

This invention relates to aluminum-containing substrates that are useful for manufacturing lithographic printing plate precursors with improved performance properties. The inventive aluminum-containing substrate can be prepared using three separate and sequential anodizing processes to provide three different aluminum oxide layers with different structural properties. This invention also relates to lithographic printing plate precursors and to a method for imaging and processing such precursors to provide lithographic printing plates. The invention further relates to a method of making such precursors using the unique series of anodization processes.

BACKGROUND OF THE INVENTION

In lithographic printing, lithographic ink receptive regions, known as image areas, are generated on a hydrophilic surface of a substrate. When the printing plate surface is moistened with water and a lithographic printing ink is applied, hydrophilic regions retain the water and repel the lithographic printing ink, and the lithographic ink receptive image regions accept the lithographic printing ink and repel the water. The lithographic printing ink is transferred from the lithographic printing plate to the surface of a material upon which the image is to be reproduced, perhaps with the use of a blanket roller.

Imageable elements or lithographic printing plate precursors used to prepare lithographic printing plates typically comprise one or more radiation-sensitive imageable layers disposed on the outermost hydrophilic surface of the substrate. Such radiation-sensitive imageable layers comprise one or more radiation-sensitive components that can be dispersed together and within a polymeric binder material. Alternatively, a radiation-sensitive component can also serve as or form a polymeric binder material. Following imaging, either the exposed (imaged) regions or the non-exposed (non-imaged) regions of the one or more radiation-sensitive imageable layers can be removed using a suitable developer, revealing the outermost hydrophilic surface of the substrate. If the exposed regions are removable, the lithographic printing plate precursor is considered positive-working. Conversely, if the non-exposed regions are removable, the lithographic printing plate precursor is considered negative-working.

Direct digital thermal imaging of lithographic printing plate precursors has become increasingly important in the printing industry in the last 30 years because of their stability to ambient light. Such precursors have been designed to be sensitive to imaging near-infrared radiation or infrared radiation having a wavelength of at least 750 nm. However, other useful lithographic printing plate precursors are designed to be sensitive to direct digital imaging with UV or "violet" radiation of at least 250 nm to about 450 nm.

Negative-working lithographic printing plate precursors useful to prepare lithographic printing plates typically comprise a negative-working radiation-sensitive imageable layer disposed over the hydrophilic surface of a substrate. Radiation-sensitive photopolymerizable compositions used in negative-working lithographic printing plate precursors typically comprise free-radically polymerizable components, one or more radiation absorbers, an initiator composition, and optionally one or more polymeric binders that are different from the other noted components.

In recent years, there has been an emphasis in the industry for simplification of the lithographic printing plate making process, including an omission of the pre-development heating step (preheat) and carrying out development on-press using a lithographic printing ink, fountain solution, or both, to remove unwanted (non-exposed) imageable layer materials in the lithographic printing plate precursors. Such negative-working lithographic printing plate precursors must be designed by balancing many features within the element structure in order to achieve optimal press life, on-press developability, ink-water balance (determined using a restart toning test), and scratch resistance. It has not been an easy task to achieve high quality in all of these properties simultaneously because what chemical composition or structural features may provide optimal level in one or two properties may cause a loss in another property.

Independently of the type of lithographic printing plate precursor, lithography has generally been carried out using a metal-containing substrate comprising aluminum or an aluminum-alloy of various metal compositions, for example containing up to 10 weight % of one or more of other metals known in the art for this purpose. The raw stock aluminum-containing material can be cleaned in a "pre-etch" process using a base or surfactant solution to remove oil, grease, and other contaminants on the generally planar surface of the raw stock aluminum-containing material. The cleaned surface is then generally roughened by electrochemical or mechanical graining, followed by a "post-etch" treatment to remove any contaminants ("smut") formed during the graining process. Further industrial details of the preparation of useful substrates for lithographic printing plate precursors are found, for example in U.S. Patent Application Publication 2014/0047993 A1 (Hauck et al.).

After further rinsing, the surface of the aluminum-containing substrate is generally anodized once or twice to provide hydrophilic aluminum oxide for abrasion resistance and other properties of the resulting lithographic printing plate precursor once one or more radiation-sensitive imageable layers have been formed thereon.

One or two anodizing processes are used in some known methods of making precursor substrates, for example as described in U.S. Pat. No. 4,566,952 (Sprintschnik et al.), U.S. Pat. No. 8,789,464 (Tagawa et al.), U.S. Pat. No. 8,783,179 (Kurokawa et al.), U.S. Pat. No. 8,978,555 (Kurokawa et al.), and U.S. Pat. No. 9,259,954 (Tagawa et al.), in U.S. Patent Application Publication 2014/0326151 (Namba et al.), and in EP 2,353,882A1 (Tagawa et al.).

U.S. Patent Application Publication 2018/0250925 (Merka et al.) describes a lithographic printing plate precursor with an improved aluminum-containing substrate designed using two different anodizing treatments in sequence, to provide two different aluminum oxide layers having different layer thickness, pore diameters, and porosities. On-press developability and scratch resistance of the exposed precursors were improved with this innovative approach to aluminum-containing substrate preparation.

Aluminum-containing substrates can be fabricated by applying sulfuric acid, phosphoric acid, oxalic acid, other acids, or acid mixtures known to the skilled artisan as electrolytes in combination with various process parameters in order to produce one or more anodic (aluminum oxide) layers of specific structures and thus achieve specific properties in the resulting precursors. However, there remains a strong need to develop new functional porous structures during anodization so that improved scratch resistance, on-press developability, and improved press life are achieved without sacrificing the proper balancing of lithographic printing ink and fountain solution during print run startup and printing.

SUMMARY OF THE INVENTION

To address the noted problem, the present invention provides an aluminum-containing substrate comprising:

an aluminum-containing plate having a grained and etched surface;

an inner aluminum oxide layer over the grained and etched surface, the inner aluminum oxide layer having an average dry thickness ($T_i$) of at least 500 nm and up to and including 1,500 nm; and comprising a multiplicity of inner pores having an average inner pore diameter ($D_i$) of more than 0 nm but less than 15 nm;

a middle aluminum oxide layer over the inner aluminum oxide layer, the middle aluminum oxide layer having an average dry thickness ($T_m$) of at least 60 nm and up to and including 300 nm; comprising a multiplicity of middle pores having an average middle pore diameter ($D_m$) of at least 15 nm and up to and including 60 nm; and having a middle pore density ($C_m$) of at least 100 middle pores/$\mu m^2$ and up to and including 2,000 middle pores/$\mu m^2$; and an outer aluminum oxide layer over the middle aluminum oxide layer, the outer aluminum oxide layer having an average dry thickness ($T_o$) of at least 30 nm and up to and including 150 nm; comprising a multiplicity of outer pores having an average outer pore diameter ($D_o$) of at least 5 nm and up to and including 35 nm; and having an outer pore density ($C_o$) of at least 100 outer pores/$\mu m^2$ and up to and including 5,000 outer pores/$\mu m^2$;

wherein the dry thickness of the combination of the middle aluminum oxide layer and the outer aluminum oxide layer is at least 120 nm and up to and including 420 nm, and wherein $D_m$ is larger than $D_o$ that is larger than $D_i$, and optionally, a hydrophilic layer comprising one or more hydrophilic polymers provided at a dry coverage of at least 0.0002 g/$m^2$ and up to and including 0.1 g/$m^2$.

Moreover, the present invention provides a lithographic printing plate precursor comprising:

an aluminum-containing substrate of any embodiment according to of the present invention, and a radiation-sensitive imageable layer disposed over the aluminum-containing substrate.

A method for providing a lithographic printing plate of the present invention, comprises:

imagewise exposing the lithographic printing plate precursor of any embodiment of the present invention to imaging radiation to form an imagewise exposed imageable layer having exposed regions and non-exposed regions, and removing either the exposed regions or the non-exposed regions, but not both exposed regions and non-exposed regions, from the imagewise exposed imageable layer, to form a lithographic printing plate.

This invention further provides a method for preparing a lithographic printing plate precursor according to the present invention, this method comprising, in order:

A) providing an aluminum-containing plate having an electrochemically or mechanically grained and etched surface;

B) subjecting the aluminum-containing plate to a first anodizing process using phosphoric acid to form an outer aluminum oxide layer over the electrochemically or mechanically grained and etched surface, the outer aluminum oxide layer having an average dry thickness ($T_o$) of at least 30 nm and up to and including 150 nm; comprising a multiplicity of outer pores having an average outer micropore diameter ($D_o$) of at least 5 nm and up to and including 35 nm; and having an outer pore density ($C_o$) of at least 100 outer pores/$\mu m^2$ and up to and including 5,000 outer pores/$\mu m^2$;

C) optionally, rinsing the outer aluminum oxide layer;

D) subjecting the aluminum-containing plate to a second anodizing process using phosphoric acid to form a middle aluminum oxide layer underneath the outer aluminum oxide layer, the middle aluminum oxide layer having an average dry thickness ($T_m$) of at least 60 nm and up to and including 300 nm; comprising a multiplicity of middle pores having an average middle pore diameter ($D_m$) of at least 15 nm and up to and including 60 nm; and having a middle pore density ($C_m$) of at least 100 middle pores/$\mu m^2$ and up to and including 2,000 middle pores/$\mu m^2$;

E) optionally, rinsing the middle aluminum oxide layer;

F) subjecting the aluminum-containing plate to a third anodizing process using sulfuric acid to form an inner aluminum oxide layer underneath the middle aluminum oxide layer, the inner aluminum oxide layer having an average dry thickness ($T_i$) of at least 500 nm and up to and including 1,500 nm; and comprising a multiplicity of inner pores having an average inner pore diameter ($D_i$) of more than 0 nm but less than 15 nm, to form an aluminum-containing substrate, wherein $D_m$ is larger than $D_o$ that is larger than $D_i$;

G) optionally, rinsing the inner aluminum oxide layer;

H) optionally, applying a hydrophilic composition comprising one or more hydrophilic polymers to provide a dry coverage of at least 0.0002 g/$m^2$ and up to and including 0.1 g/$m^2$; and I) disposing a radiation-sensitive imageable layer over the aluminum-containing substrate.

The combination of features defined for the aluminum-containing substrate according to the present invention provides improved scratch resistance and proper balancing of lithographic printing ink and fountain solution during print run startup and press printing, without sacrificing on-press developability and high press life. These advantages are achieved by using a combination of three anodizing processes that are carried out in sequence and in such a manner as to achieve unique pore and porosity features in all of the resulting inner, middle, and outer aluminum oxide layers in the inventive aluminum-containing substrates. As the data provided herein demonstrate, when any of the three aluminum oxide layers is outside the required limits, one or more of scratch resistance, ink/fountain solution balance in non-image regions, on-press developability (for negative-working lithographic printing plate precursors), or press life, are undesirably reduced or impaired in some manner in the lithographic printing plates.

BRIEF DESCRIPTION OF THE DRAWING

FIG. 1 is a schematic cross-sectional view of an embodiment of aluminum-containing substrates according to the present invention, showing the relative depths and pore diameter dimensions for the three individual and unique outer, middle, and inner aluminum oxide layers on an aluminum-containing plate or support material ("Al").

DETAILED DESCRIPTION OF THE INVENTION

The following discussion is directed to various embodiments of the present invention and while some embodiments can be desirable for specific uses, the disclosed embodiments should not be interpreted or otherwise considered to limit the scope of the present invention, as claimed below. In addition, one skilled in the art will understand that the following disclosure has broader application than is explicitly described in the discussion of any particular embodiment.

Definitions

As used herein to define various components of the radiation-sensitive imageable layer formulations (and resulting applied layers), processing solutions, anodizing solutions, hydrophilic layer formulations (and resulting applied layers), and other materials used in the practice of this invention, unless otherwise indicated, the singular forms "a," "an," and "the" are intended to include one or more of the components (that is, including plurality referents).

Each term that is not explicitly defined in the present application is to be understood to have a meaning that is commonly accepted by those skilled in the art. If the construction of a term would render it meaningless or essentially meaningless in its context, the term should be interpreted as having a standard dictionary meaning.

The use of numerical values in the various ranges specified herein, unless otherwise expressly indicated, are considered to be approximations as though the minimum and maximum values within the stated ranges were both preceded by the word "about." In this manner, slight variations above and below the stated ranges may be useful to achieve substantially the same results as the values within the ranges. In addition, the disclosure of these ranges is intended as a continuous range including every value between the minimum and maximum values as well as the end points of the ranges.

Unless the context indicates otherwise, when used herein, the terms "negative-working radiation-sensitive lithographic printing plate precursor," "positive-working radiation-sensitive lithographic printing plate," "precursor," "radiation-sensitive precursor," and "lithographic printing plate precursor" are meant to be references of certain embodiments of the present invention. The term "precursor" can be considered the most generic term for the articles obtained according to the present invention.

The term "aluminum-containing plate" is used herein to refer to an aluminum-containing sheet, web, strip, sheet, foil, or other metallic form that can be then treated to prepare an "aluminum-containing substrate" according to the present invention, as described in more detail below.

The terms "outer pore" and "outer pores" refer to microscopic pores present in the outer aluminum oxide (or outer anodic oxide) layer.

The terms "middle pore" and "middle pores" refer to microscopic pores present in the middle aluminum oxide (or middle anodic oxide) layer.

The terms "inner pore" and "inner pores" refer to microscopic pores present in the inner aluminum oxide (or inner anodic oxide) layer.

Aluminum oxide layers are acknowledged as individual from each other if "significant" differences in the pore diameter, pore density, or porosity are present. Each aluminum oxide layer has a minimum thickness of at least 20 nm. It can also be considered that two adjacent aluminum oxide layers can be connected through a "transition phase" having up to 10 nm thickness, in which the pore diameter, pore density, and porosity can change (or "transition") in order to connect the pore structures of the two aluminum oxide layers. Thus, during each aluminum oxide transition phase, the defined parameters of one aluminum oxide layer can gradually change to the defined parameters of the adjacent aluminum oxide layer.

Average outer pore diameter ($D_o$) in nanometers (nm) can be determined from a top view SEM image at a magnification of at least 100,000× taken of the aluminum-containing substrate surface before the application of any hydrophilic layer and radiation-sensitive imageable layer(s). Alternatively, it is also possible to strip away applied organic layers with appropriate solvents in order to determine the outer pore diameter ($D_o$) of a lithographic printing plate precursor by SEM. The $D_o$ can be determined by reviewing at least 200 outer pores. Additionally, by comparing top view SEM micrographs at a magnification of at least 100,000× taken of the aluminum-containing substrate surface after removing different fractions of the outer aluminum oxide layer, for example 25% and 75%, respectively, using an appropriate technique such as argon ion beam sputtering, it can be determined that the outer pore diameter $D_o$, the outer pore density $C_O$ and the porosity $P_o$ do not change significantly within the depth of the outer aluminum oxide layer.

Average middle pore diameter ($D_m$) can be determined from a top view SEM micrograph at a magnification of at least 100,000× taken of the aluminum-containing substrate surface after removing the outer aluminum oxide layer using an appropriate technique such as argon ion beam sputtering. The $D_m$ can be determined by reviewing at least 200 middle pores. Additionally, by comparing top view SEM micrographs at a magnification of at least 100,000× taken of the aluminum-containing substrate surface after removing different fractions of the middle aluminum oxide layer, for example 25% and 75%, respectively, in addition to the outer aluminum oxide layer, using an appropriate technique such as argon ion beam sputtering, it can be determined that the middle pore diameter $D_m$, the middle pore density $C_m$ and the porosity $P_m$ do not change significantly within the depth of the middle aluminum oxide layer.

The average inner pore diameter ($D_i$) can be determined from a cross-sectional view SEM micrograph at a magnification of at least 100,000×. The cross-section can be generated by bending the lithographic printing plate precursor or its aluminum-containing substrate after the radiation-sensitive imageable layer(s) and any optional hydrophilic layer have been removed. During bending, cracks are formed in all the aluminum oxide layer(s) and new surfaces are formed usually at the weakest position, which is usually located at the thinnest walls between adjacent inner pores. The resulting new surfaces of cracks provide cross-sectional views of many inner pores. For the present invention, it is not necessary to determine the exact average inner pore diameter ($D_i$) as long as at least 90% of revealed pore cross-sections have a width greater than zero nm and less than 15 nm. The $D_i$ can be determined by reviewing at least 200 inner pores. Additionally, by comparing top view SEM micrographs at a magnification of at least 100,000× taken of the aluminum-containing substrate surface after removing different fractions of the inner aluminum oxide layer, for example 25% and 75%, respectively, in addition to the outer and middle aluminum oxide layers, using an appropriate technique such as argon ion beam sputtering, it can be determined that the inner pore diameter $D_i$, the inner pore density $C_i$ and the porosity $P_i$ do not change significantly within the depth of the inner aluminum oxide layer.

Each of the average dry thickness ($T_o$) of the outer aluminum oxide layer, the average dry thickness ($T_m$) of the middle aluminum oxide layer, and the average dry thickness ($T_i$) of the inner aluminum oxide layer, in nanometers (nm), can be determined by measuring the length of 50 individual pores in 5 individual cross-sectional SEM micrographs of at least 50,000× magnification of a sample of aluminum-containing substrate that has been subjected to the three anodizing processes according to the present invention. The cross-sections of each aluminum oxide layer can be revealed through the cracks formed by bending a lithographic printing plate precursor or its aluminum-containing substrate. The cross-sections of an aluminum oxide layer can also be revealed by cutting a slot through the aluminum oxide layer using a focused ion beam (FIB), a technique well known in the art.

The outer aluminum oxide layer pore density ($C_o$), in outer pores/$\mu m^2$, can be determined from a top view SEM micrograph of at least 100,000× magnification by counting the number of outer pores in a predetermined area of a square having an area of at least 500 nm by 500 nm.

Correspondingly, the middle aluminum oxide layer pore density ($C_m$), in middle pores/$\mu m^2$, can be determined from a top view SEM micrograph of at least 100,000× magnification by counting the number of middle pores in a predetermined area of a square having an area of at least 500 nm by 500 nm after removal of the outer aluminum oxide layer using an appropriate technique such as argon ion beam sputtering.

It is possible that some or all of the outer pores can be connected in whole or in part to some or all middle pores, and alternatively or additionally, some or all of the middle pores can be connected to some or all inner pores. Thus, some or all pores in a given aluminum oxide layer can be connected to pores in one or more adjacent aluminum oxide layers. Moreover, it is possible that pores in a specific aluminum oxide layer can be connected to other pores in that same aluminum oxide layer.

Thus, the middle pores and outer pores present in the middle aluminum oxide layer and outer aluminum oxide layer, respectively, are generally open tubular pores, while the inner pores in the inner aluminum oxide layers are tubular in geometry but are generally closed at one end (bottom) by what is often called a "barrier" layer as part of the aluminum-containing support (or plate). The dry thickness of any such barrier layer is quite small and is not included in the definition of $T_i$, described herein.

As used herein, the term "radiation absorber" refers to a compound or material that absorbs electromagnetic radiation in a defined region and typically refers to compounds or materials that have an absorption maximum in the region of at least 250 nm (UV and violet) and higher, or up to and including 1400 nm.

As used herein, the term "infrared region" refers to radiation having a wavelength of at least 750 nm and higher. In most instances, the term "infrared" is used to include the "near-infrared" region of the electromagnetic spectrum that is defined herein to be at least 750 nm and up to and including 1400 nm. Higher wavelengths are usually considered to be in the conventional "infrared" region. Similarly, infrared radiation absorbers provide sensitivity in this infrared region.

For clarification of definitions for any terms relating to polymers, reference should be made to "Glossary of Basic Terms in Polymer Science" as published by the International Union of Pure and Applied Chemistry ("IUPAC"), *Pure Appl. Chem.* 68, 2287-2311 (1996). However, any definitions explicitly set forth herein should be regarded as controlling.

As used herein, the term "polymer" is used to describe compounds with relatively large molecular weights formed by linking together many small reacted monomers. As the polymer chain grows, it folds back on itself in a random fashion to form coiled structures. With the choice of solvents, a polymer can become insoluble as the chain length grows and become polymeric particles dispersed in the solvent medium. These particle dispersions can be very stable and useful in radiation-sensitive imageable layers described for use in the present invention. Moreover, unless indicated otherwise, the term "polymer" refers to a non-crosslinked material. Thus, crosslinked polymeric particles differ from the non-crosslinked polymeric particles in that the latter can be dissolved in certain organic solvents of good solvating property whereas the crosslinked polymeric particles may swell but do not dissolve in the organic solvent because the polymer chains are connected by strong covalent bonds.

The term "copolymer" refers to polymers composed of two or more different repeating or recurring units that are arranged along the copolymer backbone.

The term "polymer backbone" refers to the chain of atoms in a polymer to which a plurality of pendant groups can be attached. An example of such a polymer backbone is an "all carbon" backbone obtained from the polymerization of one or more ethylenically unsaturated polymerizable monomers. Some polymer backbones can comprise both carbon and heteroatoms if the polymer is formed using polymerization reactions and suitable reactants.

Recurring units in polymeric binders described herein are generally derived from the corresponding ethylenically unsaturated polymerizable monomers used in a polymerization process, which ethylenically unsaturated polymerizable monomers can be obtained from various commercial sources or prepared using known chemical synthetic methods.

As used herein, the term "ethylenically unsaturated polymerizable monomer" refers to a compound comprising one or more ethylenically unsaturated (—C=C—) bonds that are polymerizable using free radical or acid-catalyzed polymerization reactions and conditions. It is not meant to refer to chemical compounds that have only unsaturated —C=C— bonds that are not polymerizable under these conditions.

Unless otherwise indicated, the term "%" (percent) refers to "weight %". Unless otherwise indicated, the percentages can be the same for either a dry layer or the total solids of the formulation or composition used to form that dry layer.

As used herein, a radiation-sensitive and negative-working layer is both sensitive to suitable radiation (for example infrared radiation) and negative-working in the formation of lithographic printing plates. Similarly, a radiation-sensitive and positive-working layer is both sensitive to infrared radiation and positive-working in the formation of lithographic printing plates.

Uses

The aluminum-containing substrates and lithographic printing plate precursors of the present invention are useful for forming lithographic printing plates for lithographic printing using a lithographic printing ink and fountain solution. These precursors are prepared with the structure and components described as follows, and they include an inventive aluminum-containing substrate as described herein. In addition, the present invention is useful for preparing such lithographic printing plates by imagewise exposing and processing the exposed precursor off-press using a suitable developer or on-press using a lithographic printing ink, a fountain solution, or a combination of a lithographic printing ink and a fountain solution as described below. The lithographic printing plate precursors of the present invention can be designed to be either negative-working or positive-working using the appropriate radiation-sensitive imaging materials and manufacturing procedures described below.

The present invention is also useful for manufacturing of such aluminum-containing substrates and the lithographic printing plate precursors that can then be sold to customers for use in imaging and lithographic printing.

Inventive Aluminum-Containing Substrate

The aluminum-containing inventive substrates useful in the present invention are designed with critical features and properties in order to achieve the advantages described above.

A general description relating to the production of aluminum-containing substrates can be found in US Patent Application Publication 2018/0250925 (noted above), the disclosure of which is herein incorporated by reference for details is not explicitly provided herein, as well as the numerous publications cited therein, and those disclosures of the cited US publications and patents are incorporated herein by reference for this purpose.

In general, an aluminum-containing substrate can be derived from a pure aluminum material or an aluminum alloy containing up to 10% by weight of one or more elements including but not limited to, manganese, silicon, iron, titanium, copper, magnesium, chromium, zinc, bismuth, nickel, and zirconium. The pure aluminum- or aluminum alloy-containing support (or "plate" or "raw stock") can have any form with which it can be further processed, including sheets, continuous webs, rolls, and coiled strips as long as it generally has at least one surface that can be treated as described below to form a hydrophilic surface in the inventive aluminum-containing substrates. It is also possible to use polymeric films or papers onto which pure aluminum- or aluminum alloy-containing layers are deposited or laminated to provide an aluminum-containing hydrophilic surface.

The resulting aluminum-containing substrate should be thick enough to mechanically withstand the conditions in a modern printing press, but thin enough to be installed on (or wrapped around) a printing cylinder of such a machine. Thus, the aluminum-containing substrates should also have appropriate tensile strength, elasticity, crystallinity, and conductivity needed for precursor manufacturing and lithographic printing. These properties can be achieved using standard methods such as heat treatments or cold and hot rolling processes typical for the fabrication of continuous lithographic support strips, webs, or coils. Dry thicknesses of the resulting inventive aluminum-containing substrates after all treatments are generally at least 100 µm and up to and including 600 µm.

The raw stock aluminum-containing supports (or aluminum-containing plates) can be treated using typical lithographic printing plate precursor manufacturing processes, including pre-etch, water rinse, roughening, water rinse, post-etch, water rinse, before carrying out the essential first, second, and third anodizing processes and additional rinses, as described in more detail below.

The raw stock aluminum-containing plate is typically subjected to a pre-etching step to remove oil, grease, and metallic or other contaminants at or near the surfaces. As is known in the art, this pre-etching step can be carried out using a sodium hydroxide or another aqueous alkaline solution, a suitable amount of aluminum, and even certain organic solvents at known concentrations, times, and temperatures. A separate or additional degreasing step can be carried out using an aqueous surfactant solution if desired.

A skilled worker would be able to carry out routine experimentation to find the optimal pre-etching conditions (for example, optimal solution concentration, dwell time, and temperature).

Typically, after the pre-etching step, the etched aluminum-containing support is "roughened" in a suitable manner such as by using a known electrochemical or mechanical roughening (or graining) process. In electrochemical graining treatments, the etched aluminum-containing support can be processed with alternating electric current in a solution of 5 to 20 grams/liter (g/l) of hydrochloric acid and a suitable amount of aluminum. It is also possible to use solutions of nitric acid or sulfuric acid, or mixtures of these acids (for example, at up to 2.5 weight % of one or more acids). Such electrochemical graining solutions can also contain additives such as corrosion inhibitors and stabilizers, including but not limited to metal nitrates, metal chlorides, monoamines, diamines, aldehydes, phosphoric acid, chromic acid, boric acid, lactic acid, acetic acid, and oxalic acid. For example, electrochemical graining can be carried out using the processes described in U.S. Patent Application Publication 2008/0003411 (Hunter et al.), the disclosure of which is incorporated herein by reference. A skilled worker would be able to determine by routine experimentation the optimal conditions for either electrochemical or mechanical graining. Mechanical graining processes can be carried out for example with suitable brushes alone or in combination with a slurry of abrasive materials such as silica particles or alumina particles. Alternatively, a combination of mechanical and electrochemical graining processes can be used.

During roughening or graining, smut can be formed on the surface of the aluminum-containing support and this smut can be removed in a post-etching step using a treatment with a highly acidic or highly alkaline solution, for example, that can remove 0.01-5.0 g/m$^2$ of the aluminum-containing support surface. For example, post-etching can be carried out using a solution of sodium hydroxide, trisodium phosphate, or sulfuric acid and a suitable amount of aluminum. The amount of post-etching can be controlled by setting dwell time, concentration, and temperature of the etching solution. A suitable amount of post-etching also depends on the amount of roughening and the amount of smut formed in that step. The post-etching treatment must be sufficient to remove the smut, but it should not destroy too much of the surface structures formed in the roughening step. Thus, there are many combinations of the parameters that a skilled artisan can consider during routine experimentation to find the optimum post-etching conditions.

The foregoing steps result in an electrochemically or mechanically grained (roughened) and etched surface in the aluminum-containing support.

The next steps carried out according to the present invention include a first anodizing process, a second anodizing process, and a third anodizing process, in sequence, all of which anodizing processes are essential to the present invention, to form individual outer, middle, and inner aluminum oxide layers, respectively.

The method of the present invention does not require additional anodizing processes (that is, for example, barrier layer thickening as a fourth or additional anodizing process) as are sometimes described in the prior art, so that in all embodiments, the first, second, and third anodizing processes described herein are the only necessary anodizing processes. Moreover, the advantages of the present invention cannot be achieved using only two anodizing processes as is common in much of the industry and is described in the patent literature.

In addition, while barrier layer thickening is sometimes described in the art as a third or additional anodizing process (for example, as described in U.S. Pat. No. 9,259,954, noted above), this treatment is merely used to enhance the "barrier" between the inner pores of an inner aluminum oxide layer and the aluminum-containing support (or plate). The method and articles of the present invention do not utilize this teaching to enhance the barrier layer and are very different, for example, from the optional three anodizing processes in U.S. Pat. No. 9,259,954 (noted above) wherein the $D_o$, $D_m$, and $D_i$ (average pore diameters defined above) achieved thereby would have the relationship of $D_o > D_m$, whereas the aluminum oxide layers obtained according to the present invention are defined by the essential relationship of $D_m > D_o$.

Each of the first, second, and third anodizing processes can be generally carried out independently using sulfuric, phosphoric, oxalic acid, other acids, or acid mixtures as electrolyte solutions known to the skilled artisan at a suitable temperature of at least 20° C. and up to and including 70° C. for at least 1 second and up to and including 250 seconds, sufficient conditions to provide a total dry aluminum oxide coverage (sum total for all of outer, middle, and inner aluminum oxide layers) of at least 0.5 g/m² and up to and including 4 g/m². The conditions for each anodizing process are chosen to achieve the respective desired aluminum oxide layer properties. In addition, the anodizing conditions are designed so that the dry thickness of the combination of the middle aluminum oxide layer and the outer aluminum oxide layer ($T_m + T_o$), including any "aluminum oxide transition phase" between the two aluminum oxide layers, is at least 120 nm and up to and including 400 nm or up to and including 420 nm. According to the present invention, the relationship of average pore diameters of the three aluminum oxide layers is $D_m > D_o > D_i$. In addition, the ratio of the average outer pore density to the average middle pore density ($C_o/C_m$) can be at least 1.1:1.0, at least 1.5:1.0, or at least 2.0:1.0. A relative comparison of the average pore diameters for all three aluminum oxide layers is illustrated schematically in FIG. 1. The conditions are described as follows for the sequential first, second, and third anodizing processes.

A suitable aluminum-containing support (or plate) having an electrochemically or mechanically grained and etched surface is subjected to a first anodizing process to form an outer aluminum oxide layer on that electrochemically or mechanically grained and etched surface.

The first anodizing process can be carried out to form an outer aluminum oxide layer connected to the middle aluminum oxide layer formed later (described below), for example, using an electrolyte composition containing at least 50 g/liter and up to and including 350 g/liter of phosphoric acid or at least 5 g/1 and up to and including 300 g/liter of oxalic acid, or mixtures of these acids and a suitable amount of aluminum, for example 5 g/liter. These solution amounts can be optimized as to type of acid, acid concentration, aluminum concentration, dwell time, and temperature in order to achieve the desired outer aluminum oxide layer properties as described herein. Representative details of such first anodizing process are illustrated in the working Examples described below.

The resulting outer aluminum oxide layer then comprises a multiplicity of outer pores having an average outer pore diameter ($D_o$) of at least 5 nm, or at least 10 nm, and up to and including 30 nm or up to and including 35 nm, or up to and including 35 nm. In addition, the average dry thickness ($T_o$) of the outer aluminum oxide layer can be at least 30 nm or at least 40 nm, and up to and including 120 nm or up to and including 140 nm, or up to and including 150 nm. The outer pore density ($C_o$) of the outer anodizing layer can be generally at least 100 outer pores/µm² and up to and including 5,000 outer pores/µm².

Moreover, the average outer pore diameter ($D_o$) in nanometers and the outer pore density ($C_o$) in outer pores/µm² of the outer aluminum oxide layer are further constrained or related to define the outer aluminum oxide layer porosity ($P_o$) as $3.14(C_o)(D_o^2)/4,000,000$. The porosity of the outer aluminum oxide layer ($P_o$) can be at least 0.30, or at least 0.40, or at least 0.45 and up to and including 0.65, or up to and including 0.75, or up to and including 0.80.

Once the first anodizing process has been carried out for the desired time, the formed outer aluminum oxide layer can be rinsed, if desired, with a suitable solution such as water at a suitable temperature and time to remove residual acid and aluminum.

The second anodizing process is then carried out to form a middle aluminum oxide layer underneath the outer aluminum oxide layer (described above), and over the inner aluminum oxide layer formed later (described below).

The second anodizing process can be carried out, for example, using an electrolyte composition containing at least 50 g/liter and up to and including 350 g/liter of phosphoric acid or at least 5 g/liter and up to and including 300 g/liter of oxalic acid or mixtures of these acids, and a suitable amount of aluminum, for example 5 g/liter. These solution amounts can be optimized as to type of acid, acid concentration, aluminum concentration, dwell time, and temperature in order to achieve the desired middle aluminum oxide layer properties as described herein. Representative details of such second anodizing process are illustrated in the working Examples described below.

The resulting middle aluminum oxide layer then comprises a multiplicity of middle pores having an average middle pore diameter ($D_m$) of at least 15 nm, or at least 17 nm, or at least 19 nm and up to and including 40 nm, or up to and including 50 nm, or up to and including 55 nm, or up to and including 60 nm. In addition, the average dry thickness ($T_m$) of the middle aluminum oxide layer can be at least 60 nm, or at least 70 nm, or at least 100 nm and up to and including 250 nm, or up to and including 280 nm, or up to and including 300 nm. The middle pore density ($C_m$) of the middle anodizing layer is generally at least 100 middle pores/µm² and up to and including 2,000 middle pores/µm².

Moreover, the average middle pore diameter ($D_m$) in nanometers and the middle pore density ($C_m$) in middle pores/µm² of the outer aluminum oxide layer are further constrained or related to define the middle aluminum oxide layer porosity ($P_m$) as $3.14(C_m)(D_m^2)/4,000,000$. The porosity of the middle aluminum oxide layer ($P_m$) can be at least 0.15, or at least 0.18, or at least 0.20 and up to and including 0.50, or up to and including 0.55, or up to and including 0.65.

Once the second anodizing process has been carried out for the desired time, the middle and outer aluminum oxide layers can be rinsed, if desired, with a suitable solution such as water at a suitable temperature and time to remove residual acid and aluminum.

The essential third anodizing process is then carried out to form an inner aluminum oxide layer, using a suitable electrolyte composition that can comprise at least 100 g/liter and up to and including 350 g/liter of sulfuric acid as well as a suitable amount of aluminum, for example 5 g/liter. These solution amounts can be optimized as to acid concentration, aluminum concentration, dwell time, and temperature in order to achieve the desired inner aluminum oxide layer properties as described herein. The details of such third anodizing process are illustrated in the working Examples described below.

The resulting inner aluminum oxide layer directly underneath the middle aluminum oxide layer and in contact with the grained and etched surface of the substrate should comprise a multiplicity of inner pores having an average inner pore diameter ($D_i$) larger than zero (0 nm), but less than 15 nm, or up to and including 12 nm. In addition, the average dry thickness ($T_i$) of the inner aluminum oxide layer can be at least 500 nm, or at least 550 nm, or at least 700 nm and up to and including 1000 nm, or up to and including 1,500 nm.

Once the third anodizing process is carried out for a desired time, the three formed aluminum oxide layers can be rinsed, if desired, with a suitable solution such as water, at a suitable temperature and time to remove residual acid and aluminum.

While it is not essential, and is optional, it is usually desirable to provide a hydrophilic layer on the outer aluminum oxide layer in what is sometimes known in the art as a "post-anodic treatment." When used, the hydrophilic layer can be provided from a hydrophilic layer formulation comprising one or more hydrophilic polymers known in the art to provide a dry coverage of the hydrophilic layer of at least 0.0002 $g/m^2$, or at least 0.005 $g/m^2$, and up to and including 0.08 $g/m^2$ or up to and including 0.1 $g/m^2$. Useful hydrophilic polymers include but are not limited to, homopolymers and copolymers derived at least in part from any of (meth)acrylic acid, (meth)acrylamide, vinyl phosphoric acid dimethyl ester, and vinyl phosphonic acid, and combinations thereof. Particularly useful hydrophilic polymers (homopolymers or copolymers) comprise recurring units derived at least in part from either acrylic acid or methacrylic acid, or both. Useful hydrophilic polymers can be purchased from a number of commercial sources or prepared using known ethylenically unsaturated polymerizable monomers and polymerization reaction conditions. The hydrophilic layer and the hydrophilic layer formulation can contain additives such as inorganic acid (for example, phosphoric acid in an amount of at least 0.01 weight %), salts of inorganic acids, and surfactants, all of which are known in the art. A particularly useful hydrophilic layer formulation is described below in relation to the working Examples.

The post-anodic treatment process can be carried out in any suitable manner as described for examples in [0058]-[0061] of U.S. Patent Application Publication 2014/0047993 (note above), the disclosure of which is incorporated herein by reference. Alternatively, the post-anodic treatment process can be carried out by coating a desired amount of the hydrophilic layer formulation using a suitable solvent such as water directly onto the outer aluminum oxide layer and then drying the resulting wet coating.

After all of these essential and optional treatments, the resulting inventive aluminum-containing substrates, in any suitable form such as flat sheets or continuous webs or coils, are ready for the preparation of lithographic printing plate precursors according to the present invention.

Radiation-Sensitive Imageable Layers and Precursors

One or more radiation-sensitive imageable layers can be disposed in a suitable manner over the surface of the inventive aluminum-containing substrate, and typically over the outer aluminum oxide layer (for example, directly on that layer or on the hydrophilic layer if it is present) in a suitable manner using suitable radiation-sensitive imageable layer formulations as described in more detail below. Such radiation-sensitive imageable layers can be positive-working or negative-working in chemical nature.

Negative-Working Lithographic Printing Plate Precursors:

In some embodiments, the precursors of the present invention can be formed by suitable application of a negative-working radiation-sensitive composition as described below to a suitable inventive aluminum-containing substrate (as described above) to form a radiation-sensitive imageable layer that is negative-working on that aluminum-containing substrate. In general, the radiation-sensitive composition (and resulting radiation-sensitive imageable layer) can comprise (a) one or more free radically polymerizable components, (b) an initiator composition that provides free radicals upon exposure to imaging radiation, (c) and one or more radiation absorbers, as essential components, and optionally, a polymeric binder different from all of (a), (b), and (c), all of which essential and optional components are described in more detail below. There is generally only a single radiation-sensitive imageable layer in the negative-working precursor. It is generally the outermost layer in the precursor, but in some embodiments, there can be an outermost water-soluble hydrophilic overcoat (also known as a topcoat or oxygen barrier layer) disposed over the radiation-sensitive imageable layer.

It is particularly useful to design the components of the radiation-sensitive imageable layer in such a manner (types and forms of chemical compounds and amounts of each) that after imagewise exposure, it is on-press developable using a lithographic printing ink, a fountain solution, or a combination of a lithographic printing ink and a fountain solution. More details of on-press developability are described below.

The radiation-sensitive imageable layer composition (and radiation-sensitive imageable layer prepared therefrom) comprises (a) one or more free radically polymerizable components, each of which contains one or more free radically polymerizable groups (or two or more of such groups in some embodiments) that can be polymerized using free radical initiation. In some embodiments, the radiation-sensitive imageable layer comprises two or more free radically polymerizable components having the same or different numbers of free radically polymerizable groups in each molecule.

Useful free radically polymerizable components can contain one or more free radical polymerizable monomers or oligomers having one or more polymerizable ethylenically unsaturated groups (for example, two or more of such groups). Similarly, crosslinkable polymers having such free radically polymerizable groups can also be used. Free radically polymerizable oligomers or prepolymers, such as urethane acrylates and methacrylates, epoxide acrylates and methacrylates, polyester acrylates and methacrylates, polyether acrylates and methacrylates, and unsaturated polyester resins also can be used. In some embodiments, the free radically polymerizable component comprises carboxyl groups. Mixtures of such free radically polymerizable components can be used if desired.

It is possible for one or more free radically polymerizable components to have large enough molecular weight to enhance the mechanical properties of the radiation-sensitive imageable layer and thus make the corresponding lithographic printing plate precursors suitable for transportation in typical packaging and for handling during normal pre-press operation. It is also possible for one or more free radically polymerizable components to be present in the radiation-sensitive layer as a particulate material, the components having a particle size of at least 10 nm and up to and including 800 nm. In such embodiments, a separate non-polymerizable or non-crosslinkable polymer binder (described below) is not necessary but may still be present.

Useful free radically polymerizable components also include urea urethane (meth)acrylates or urethane (meth) acrylates having multiple (two or more) polymerizable groups. Mixtures of such compounds can be used, each compound having two or more unsaturated polymerizable groups, and some of the compounds having three, four, or more unsaturated polymerizable groups. For example, a free radically polymerizable component can be prepared by reacting DESMODUR® N100 aliphatic polyisocyanate resin based on hexamethylene diisocyanate (Bayer Corp., Milford, Conn.) with hydroxyethyl acrylate and pentaerythritol triacrylate. Useful free radically polymerizable components include NK Ester A-DPH (dipentaerythritol hexaacrylate) that is available from Kowa American, and Sartomer 399 (dipentaerythritol pentaacrylate), Sartomer 355 (ditrimethylolpropane tetraacrylate), Sartomer 295 (pentaerythritol tetraacrylate), and Sartomer 415 [ethoxylated (20)trimethylolpropane triacrylate] that are available from Sartomer Company, Inc.

Numerous other free radically polymerizable components are known in the art and are described in considerable literature including *Photoreactive Polymers: The Science and Technology of Resists*, A Reiser, Wiley, New York, 1989, pp. 102-177, by B. M. Monroe in *Radiation Curing: Science and Technology*, S. P. Pappas, Ed., Plenum, New York, 1992, pp. 399-440, and in "Polymer Imaging" by A. B. Cohen and P. Walker, in *Imaging Processes and Material*, J. M. Sturge et al. (Eds.), Van Nostrand Reinhold, New York, 1989, pp. 226-262. For example, useful free radically polymerizable components are also described in EP 1,182,033A1 (Fujimaki et al.), beginning with paragraph [0170], and in U.S. Pat. No. 6,309,792 (Hauck et al.), U.S. Pat. No. 6,569,603 (Furukawa), and U.S. Pat. No. 6,893,797 (Munnelly et al.) the disclosures of all of which are incorporated herein by reference. Other useful free radically polymerizable components include those described in U.S. Patent Application Publication 2009/0142695 (Baumann et al.), which radically polymerizable components include 1H-tetrazole groups, the disclosure of which is incorporated herein by reference.

Useful free radically polymerizable components as described above can be readily obtained from various commercial sources or prepared using known starting materials and synthetic methods.

The (a) one or more free radically polymerizable components can be generally present in a negative-working radiation-sensitive imageable layer in an amount of at least 10 weight % or at least 20 weight %, and up to and including 50 weight % or up to and including 70 weight %, all based on the total dry weight of the negative-working radiation-sensitive imageable layer.

The radiation-sensitive imageable layer used in the present invention can also comprise (b) an initiator composition that provides free radicals in the presence of a suitable radiation absorber, and upon exposure of the radiation-sensitive imageable layer to suitable imaging radiation to initiate the polymerization of the one or more free radically polymerizable components. The initiator composition can be a single compound or a combination (or system) of a plurality of compounds.

Suitable (b) initiator compositions can include but are not limited to, aromatic sulfonyl halides; trihalogenoalkyl sulfones; trihalogenoaryl sulfones; imides (such as N-benzoyloxyphthalimide); diazosulfonates; 9,10-dihydroanthracene derivatives; N-aryl, S-aryl, or O-aryl polycarboxylic acids with at least 2 carboxy groups, of which at least one is bonded to the nitrogen, oxygen, or sulfur atom of the aryl moiety; oxime esters and oxime ethers; α-hydroxy- or α-amino-acetophenones; benzoin ethers and esters; peroxides; hydroperoxides; azo compounds; 2,4,5-triarylimidazoylyl dimers (such as "HABI's"); trihalomethyl substituted triazines; boron-containing compounds; organoborate salts such as those described in U.S. Pat. No. 6,562,543 (Ogata et al.), and onium salts.

Useful (b) initiator compositions particularly for infrared radiation-sensitive compositions and imageable layers include but are not limited to, onium salts such as ammonium, iodonium, sulfonium, and phosphonium compounds that are described in detail in [0131] of U.S. Patent Application Publication 2014/0047993 (noted above), and references cited therein, the disclosures of which are incorporated herein by reference. Examples of onium salts include triphenylsulfonium, diphenyliodonium, diphenyldiazonium, and derivatives obtained by introducing one or more substituents into the benzene ring of these compounds. Suitable substituents include but are not limited to, alkyl, alkoxy, alkoxycarbonyl, acyl, acyloxy, chloro, bromo, fluoro and nitro groups.

Examples of anions in onium salts include but are not limited to, halogen anions, $ClO_4^-$, $PF_6^-$, $BF_4^-$, $SbF_6^-$, $CH_3SO_3^-$, $CF_3SO_3^-$, $C_6H_5SO_3^-$, $CH_3C_6H_4SO_3^-$, $HOC_6H_4SO_3^-$, $ClC_6H_4SO_3^-$, and boron anions as described for example in U.S. Pat. No. 7,524,614 (Tao et al.), the disclosure of which is incorporated herein by reference.

The onium salt can be obtained by combining an onium salt having sulfonium anion in the molecule with a suitable cation in the molecule. The onium salt can be a polyvalent onium salt having at least two onium anions in the molecule that are bonded through a covalent bond. Among polyvalent onium salts, those having at least two onium anions in the molecule are useful and those having multiple sulfonium or iodonium cations in the molecule are useful. Representative polyvalent onium salts are represented by the following formulas (6) and (7):

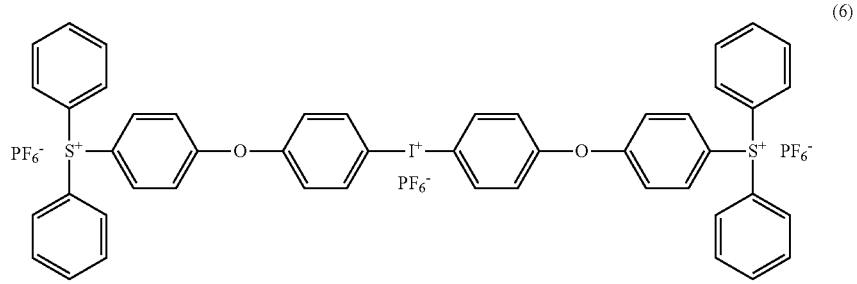

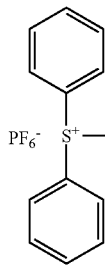 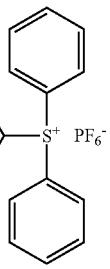

(7)

Furthermore, the onium salts described in paragraphs [0033] to [0038] of the specification of Japanese Patent Publication 2002-082429 [or U.S. Patent Application Publication 2002-0051934 (Ippei et al.), the disclosure of which is incorporated herein by reference] or the iodonium borate complexes described in U.S. Pat. No. 7,524,614 (noted above), can also be used in the present invention.

In some embodiments, the (b) initiator composition can comprise a combination of initiator compounds such as a combination of iodonium salts, for example the combination of Compound A and Compound B described in U.S. Patent Application Publication 2017/0217149 (Hayashi et al.), the disclosure of which is incorporated herein by reference. Mixtures of Compound B compounds represented by Structures (II) or (III) in the noted publication can be used if desired.

The (b) initiator composition can optionally comprise one or more suitable co-initiators, chain transfer agents, antioxidants, or stabilizers to prevent or moderate undesired radical reactions. Suitable materials for this purpose are known in the art.

Components useful in the (b) initiator compositions described above can be obtained from various commercial sources or prepared using known synthetic methods and starting materials.

The (b) initiator composition can be generally present in the radiation-sensitive imageable layer in a concentration sufficient to provide one or more polymerization initiators in an amount of at least 0.5 weight %, or at least 2 weight %, and up to and including 15 weight %, or up to and including 20 weight %, or even of at least 4 weight % and up to and including 12 weight %, all based on the total dry weight of the radiation-sensitive imageable layer.

In addition, the radiation-sensitive imageable layer comprises (c) one or more radiation absorbers to provide desired radiation sensitivity or to convert radiation to heat, or both. In some embodiments, the radiation-sensitive layer is sensitive to infrared radiation and comprises one or more different infrared radiation absorbers so that the lithographic printing plate precursors can be imaged with infrared radiation-emitting lasers. The present invention is also applicable to lithographic printing plate precursors designed for imaging with violet light-emitting lasers having emission peaks at around 405 nm, with visible light-emitting lasers such as those having emission peaks around 488 nm or 532 nm, or with UV radiation having significant emission peaks below 400 nm. In such embodiments, the radiation absorbers can be selected to match the radiation source and many useful examples are known in the art, and are sometimes called "sensitizers". Useful radiation absorbers of this types are described for example, in Col. 11 (lines 10-43) of U.S. Pat. No. 7,285,372 (Baumann et al.), the disclosure of which is incorporated herein by reference.

In most embodiments of the present invention, the negative-working radiation-sensitive imageable layer comprises one or more infrared radiation absorbers to provide desired infrared radiation sensitivity. Useful infrared radiation absorbers can be pigments or infrared radiation absorbing dyes. Suitable dyes also can be those described in for example, U.S. Pat. No. 5,208,135 (Patel et al.), U.S. Pat. No. 6,153,356 (Urano et al.), U.S. Pat. No. 6,309,792 (Hauck et al.), U.S. Pat. No. 6,569,603 (Furukawa), U.S. Pat. No. 6,797,449 (Nakamura et al.), U.S. Pat. No. 7,018,775 (Tao), U.S. Pat. No. 7,368,215 (Munnelly et al.), U.S. Pat. No. 8,632,941 (Balbinot et al.), and U.S. Patent Application Publication 2007/056457 (Iwai et al.), the disclosures of all of which are incorporated herein by reference. In some infrared radiation-sensitive embodiments, at least one infrared radiation absorber in the infrared radiation-sensitive imageable layer can be a cyanine dye comprising a tetraarylborate anion such as a tetraphenylborate anion. Examples of such dyes include those described in United States Patent Application Publication 2011/003123 (Simpson et al.), the disclosure of which is incorporated herein by reference.

In addition to low molecular weight IR-absorbing dyes, IR dye chromophores bonded to polymers can be used as well. Moreover, IR dye cations can be used, that is, the cation is an IR absorbing portion of the dye salt that ionically interacts with a polymer comprising carboxy, sulfo, phospho, or phosphono groups in the side chains.

Useful radiation absorbers described above can be readily obtained from various commercial sources or prepared using known starting materials and synthetic methods.

The total amount of one or more (c) radiation absorbers in the radiation-sensitive imageable layer can be at least 0.5 weight % or at least 1 weight %, and up to and including 15 weight %, or up to and including 30 weight %, based on the total dry weight of the radiation-sensitive imageable layer.

It is optional but desirable in many embodiments that the radiation-sensitive imageable layer further comprise one or more (d) polymeric binders (or materials that act as polymeric binders) for all of the materials in the noted layer. Such polymer binders are different from all of the (a), (b), and (c) materials described above. These polymeric binders are generally non-crosslinkable and non-polymerizable.

Such (d) polymeric binders can be selected from a number of polymeric binder materials known in the art including polymers comprising recurring units having side chains comprising polyalkylene oxide segments such as those described in for example, U.S. Pat. No. 6,899,994 (Huang et al.) the disclosure of which is incorporated herein by reference. Other useful (d) polymeric binders comprise two or more types of recurring units having different side chains comprising polyalkylene oxide segments as described in for example WO Publication 2015-156065 (Kamiya et al.). Some of such (d) polymeric binders can further comprise recurring units having pendant cyano groups as those described in for example U.S. Pat. No. 7,261,998 (Hayashi et al.) the disclosure of which is incorporated herein by reference.

Some useful (d) polymeric binders can be present in particulate form, that is, in the form of discrete and generally non-agglomerated particles. Such discrete particles can have an average particle size of at least 10 nm or at least 80 nm, and up to and including 600 or up to and including 1,500 nm, and are generally distributed uniformly within the radiation-sensitive imageable layer. For example, one or more useful (d) polymeric binders can be present in the form of particles having an average particle size of at least 50 nm and up to and including 400 nm. Average particle size can be determined by various known methods including measuring the particles in electron scanning microscope images, and averaging a set number of measurements.

In some embodiments, the (d) polymeric binder is present in the form of particles having an average particle size that is less than the average dry thickness (t) of the radiation-sensitive imageable layer. The average dry thickness (t) in micrometers (μm) is calculated by the following Equation:

$t = w/r$ wherein w is the dry coating coverage of the radiation-sensitive imageable layer in g/m² and r is 1 g/cm³. For example, in such embodiments, the (d) polymeric binder can comprise at least 0.05 weight % or at least 10 weight %, and up to and including 50 weight % or up to and including 80 weight %, based on the total dry weight of the radiation-sensitive imageable layer.

The (d) polymeric binders also can have a backbone comprising multiple (at least two) urethane moieties as well as pendant groups comprising the polyalkylene oxide segments.

Other useful (d) polymeric binders can be derived from acrylate esters, methacrylate esters, vinyl aryls, and monomers containing allyl groups as well as monomers having pendant alkali soluble groups such as carboxylic acid. Some of these useful (d) polymeric binders are described in U.S. Patent Application Publication 2015/0099229 (Simpson et al.) and U.S. Pat. No. 6,916,595 (Fujimaki et al.), the disclosures of both of which are incorporated herein by reference.

Useful (d) polymeric binders generally have a weight average molecular weight (Mw) of at least 2,000 or at least 20,000 and up to and including 300,000 or up to and including 500,000, as determined by Gel Permeation Chromatography (polystyrene standard).

Useful (d) polymeric binders can be obtained from various commercial sources or they can be prepared using known procedures and starting materials, as described for example in the publications described above.

The total (d) polymeric binders can be present in the radiation-sensitive imageable layer in an amount of at least 10 weight % or at least 20 weight %, and up to and including 50 weight % or and up to and including 70 weight %, based on the total dry weight of the radiation-sensitive imageable layer.

(e) Other polymeric materials known in the art [different from the (a), (b), (c), and (d) materials described above] can be present in the radiation-sensitive imageable layer and such (e) polymeric materials are generally more hydrophilic or more hydrophobic than the (d) polymeric binders described above. Examples of such more hydrophilic polymeric binders include but are not limited to, cellulose derivatives such as hydroxypropyl cellulose, carboxymethyl cellulose, and polyvinyl alcohol with various degrees of saponification. More hydrophobic polymeric binders are less developable than the (d) polymeric binders described above and can have an acid value less than 20 mg KOH/g for all acidic groups having a pKa below 7 and their corresponding salts. Such hydrophobic polymeric binders typically contain less than 10 weight %, more typically less than 5 weight %, segments that contribute to the hydrophilicity of the binder selected from the group consisting of hydroxyl group, —(CH$_2$CH$_2$—O)— and —C(=O)NH$_2$. Examples of such hydrophobic polymeric binders include but are not limited to, poly(methyl methacrylate), poly(benzyl methacrylate), and polystyrene.

Additional (f) optional additives to the radiation-sensitive imageable layer can include organic dyes or organic dye precursors and color developers as are known in the art. Useful organic dyes or organic dye precursors include but are not limited to, phthalide and fluoran leuco dyes having a lactone skeleton with an acid dissociable lactone skeleton, such as those described in U.S. Pat. No. 6,858,374 (Yanaka), the disclosure of which is incorporated herein by reference. Such (f) optional additives can be used as print-out colorants and can be present in an amount of at least 1 weight % and up to and including 10 weight %, based on the total dry weight of the radiation-sensitive imageable layer.

It can be desirable that the imaged negative-working lithographic printing plate precursors have different colors in the exposed regions and non-exposed regions for readability before going to the printing press. The color difference between the exposed regions and the non-exposed regions is typically called "printout" (or "print-out") or a "printout image." A strong printout will make it easier for operators to visually identify the imaged lithographic printing plate precursors and to properly attach them to printing press units. For example, U.S. Patent Application Publication 2009/0047599 (Home et al.), the disclosure of which is incorporated herein by reference, describes the use of spirolactone or spirolactam colorant precursors to provide printout images. U.S. patent application Ser. No. 16/137,676 (filed Sep. 21, 2018 by Igarashi, et al.), the disclosure of which is incorporated herein by reference, describes negative-working lithographic printing plate precursors that exhibit printout because of the presence of an acid generator, a tetraaryl borate, an acid-sensitive dye precursor, and an aromatic diol having an electron withdrawing substituent.

It is also possible to provide a printout image for negative-working infrared radiation-sensitive precursors by including in a negative-working infrared radiation-sensitive imageable layer: one or more free radically polymerizable components; one or more infrared radiation absorbers; an initiator composition; one or more color-forming compounds; and one or more compounds, each being represented by the following Structure (P):

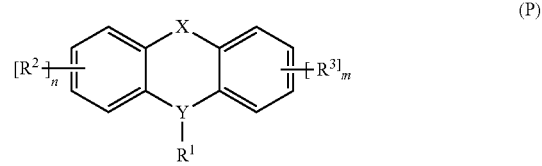

wherein X is the group —O—, —S—, —NH—, or —CH$_2$—, Y is the group >N— or >CH—, R$^1$ is hydrogen or a substituted or unsubstituted alkyl, R$^2$ and R$^3$ are independently halo, thioalkyl, thiophenyl, alkoxy, phenoxy, alkyl, phenyl, thioacetyl, or acetyl, groups, and m and n are independently 0 or an integer of from 1 to 4.

The radiation-sensitive imageable layer can include crosslinked polymer particles having an average particle size of at least 2 μm, or of at least 4 μm, and up to and including 20 μm as described for example in U.S. Pat. No. 8,383,319 (Huang et al.), U.S. Pat. No. 8,105,751 (Endo et al), and U.S. Pat. No. 9,366,962 (Kamiya et al.), the disclosures of all of which are incorporated herein by reference. Such crosslinked polymeric particles can be present in the radiation-sensitive imageable layer, in the hydrophilic overcoat when present (described below), or in both the radiation-sensitive imageable layer and the hydrophilic overcoat when present.

The radiation-sensitive imageable layer can also include a variety of other (f) optional addenda including but not limited to, dispersing agents, humectants, biocides, plasticizers, surfactants for coatability or other properties, viscosity builders, pH adjusters, drying agents, defoamers, preservatives, antioxidants, development aids, rheology modifiers, or combinations thereof, or any other addenda commonly used in the lithographic art, in conventional amounts. The radiation-sensitive imageable layer can also include a phosphate (meth)acrylate having a molecular weight generally larger than 250 as described in U.S. Pat. No. 7,429,445 (Munnelly et al.) the disclosure of which is incorporated herein by reference.

Hydrophilic Overcoat:

While in some embodiments of the negative-working lithographic printing plate precursors according to the present invention, the radiation-sensitive imageable layer is the outermost layer with no layers disposed thereon, it is possible that the precursors can be designed with a hydrophilic layer (also known in the art as a hydrophilic overcoat, oxygen-barrier layer, or topcoat) disposed directly on the radiation-sensitive imageable layer (no intermediate layers between these two layers). Such precursors can be developed on-press as well as off-press using any suitable developer as described below. When present, this hydrophilic overcoat is generally the outermost layer of the precursor.

Such hydrophilic overcoats can comprise one or more film-forming water-soluble polymeric binders in an amount of at least 60 weight % and up to and including 100 weight %, based on the total dry weight of the hydrophilic overcoat. Such film-forming water-soluble (or hydrophilic) polymeric binders can include a modified or unmodified poly(vinyl alcohol) having a saponification degree of at least 30%, or a degree of at least 75%, or a degree of at least 90%, and a degree of up to and including 99.9%.

Further, one or more acid-modified poly(vinyl alcohol)s can be used as film-forming water-soluble (or hydrophilic) polymeric binders in the hydrophilic overcoat. For example, at least one modified poly(vinyl alcohol) can be modified with an acid group selected from the group consisting of carboxylic acid, sulfonic acid, sulfuric acid ester, phosphonic acid, and phosphoric acid ester groups. Examples of such materials include but are not limited to, sulfonic acid-modified poly(vinyl alcohol), carboxylic acid-modified poly(vinyl alcohol), and quaternary ammonium salt-modified poly(vinyl alcohol), glycol-modified poly(vinyl alcohol), or combinations thereof.

The hydrophilic overcoat can also include crosslinked polymer particles having an average particle size of at least 2 μm and as described for example in U.S. Pat. No. 8,383,319 (noted above) and U.S. Pat. No. 8,105,751 (noted above).

The hydrophilic overcoat can be provided at a dry coating coverage of at least 0.1 g/m$^2$ and up to but less than 4 g/m$^2$, and typically at a dry coating coverage of at least 0.15 g/m$^2$ and up to and including 2.5 g/m$^2$. In some embodiments, the dry coating coverage can be as low as 0.1 g/m$^2$ and up to and including 1.5 g/m$^2$ or at least 0.1 g/m$^2$ and up to and including 0.9 g/m$^2$, such that the hydrophilic overcoat is relatively thin.

The hydrophilic overcoat can optionally comprise organic wax particles dispersed within the one or more film-forming water-soluble (or hydrophilic) polymeric binders as described for example in U.S. Patent Application Publication 2013/0323643 (Balbinot et al.) the disclosure of which is incorporated herein by reference.

Thus, in some embodiments, the lithographic printing plate precursor according to the present invention has:

an aluminum-containing plate that has been electrochemically grained and etched;

a radiation-sensitive imageable layer that is a negative-working and on-press developable infrared radiation-sensitive imageable layer, and that comprises:

(a) one or more free radically polymerizable components;

(b) an initiator composition that provides free radicals upon exposure of the radiation-sensitive imageable layer to infrared radiation;

(c) one or more infrared radiation absorbers; and (d) a particulate polymeric binder that is different from all of (a), (b), and (c); and further has a hydrophilic layer comprising a polymer comprising recurring units derived from acrylic acid or methacrylic acid, and that is present at a dry coverage of at least 0.005 g/m$^2$ and up to and including 0.08 g/m$^2$.

Positive-Working Lithographic Printing Plate Precursors:

Some embodiments of the present invention are precursors that are positive-working and comprise one or more radiation-sensitive imageable layers disposed on the inventive aluminum-containing substrate described above. Some of such precursors comprise a single radiation-sensitive imageable layer disposed over the inventive aluminum-containing substrate, while other precursors are two-layer ("dual-layer") precursors comprising at least an inner layer disposed over the inventive aluminum-containing substrate and an outer layer disposed over the inner layer. One or both of these layers can be radiation-sensitive, as described for example in U.S. Pat. No. 6,352,811 (Patel et al.), U.S. Pat. No. 6,893,795 (Savariar-Hauck et al.), and U.S. Pat. No. 8,993,213 (Kawauchi et al.), the disclosure of all of which are incorporated herein by reference.

The positive-working lithographic printing plate precursors of the present invention are designed for imaging using infrared radiation and therefore contain one or more infrared radiation absorbers (like those described above) dispersed in one or more alkali-soluble polymers that, upon suitable infrared irradiation, are soluble, dispersible, or removable in an alkaline solution (that is, an alkaline developer) such as used for processing (development) of such exposed precursors. Thus, the one or more layers undergo a change in solubility properties with respect to the processing solution in their irradiated (exposed) regions. The one or more infrared radiation absorbers can be present in one or more of the layers present in the precursor.

For the two-layer or "dual-layer" positive-working lithographic printing plate precursors, the inner layer (also known as the under layer) is disposed over (or directly on)

the inventive aluminum-containing substrate, and the outer layer (also known as the top layer) is generally disposed over (or directly on) the inner layer. An intermediate layer between the inner and outer radiation-sensitive layers can be present if desired. After thermal imaging, the exposed regions of the one or more layer become soluble in the alkaline developer and can be removed.

Materials (both essential and optional materials) that are useful in both "single-layer" and "dual-layer" lithographic printing plate precursors, structures of such precursors, and methods of making such precursors, are known in the art. Many details are provided for example, in [0067]-[0111] of U.S. Patent Application Publication 2014/0047993 (noted above), the disclosure of which is incorporated herein by reference.

Making Lithographic Printing Plate Precursors

The radiation-sensitive lithographic printing plate precursors of the present invention can be provided in the following manner. A radiation-sensitive imageable layer formulation comprising materials described above (for either negative-working or positive-working chemistry) can be applied to the inventive aluminum-containing substrate, usually in a continuous substrate roll or web, as described above using any suitable equipment and procedure, such as spin coating, knife coating, gravure coating, die coating, slot coating, bar coating, wire rod coating, roller coating, or extrusion hopper coating. The radiation-sensitive imageable layer formulation can also be applied by spraying onto the inventive aluminum-containing substrate. Typically, once the radiation-sensitive imageable layer formulation is applied at a suitable wet coverage, it is dried in a suitable manner known in the art to provide a desired dry coverage as noted below, thereby providing a radiation-sensitive continuous article (precursor) that can be in any suitable form such as a web from which individual precursors can be prepared using known manufacturing processes.

For dual-layer positive-working lithographic printing plate precursors, once an inner layer formulation has been applied to the inventive aluminum-containing substrate, an outer layer formulation can then be applied, usually in a sequential continuous manufacturing operation, followed by drying both inner and outer layers. Intermixing of the two layer formulations can be avoided as much as possible.

The manufacturing methods typically include mixing the various components needed for a particular layer compositions such as radiation-sensitive imageable layer composition in a suitable organic solvent or mixtures thereof [such as methyl ethyl ketone (2-butanone), methanol, ethanol, 1-methoxy-2-propanol, iso-propyl alcohol, acetone, γ-butyrolactone, n-propanol, tetrahydrofuran, and others readily known in the art, as well as mixtures thereof], applying the resulting layer formulations to a continuous aluminum-containing substrate web, and removing the solvent(s) by evaporation under suitable drying conditions. The selection of organic solvents (or mixtures thereof) can be chosen for dual-layer positive-working lithographic printing plate precursors so that the two layer formulations are not mixed to a significant extent and the inner layer formulation is not dissolved when the outer layer formulation is applied. Further details of such manufacturing features are described in U.S. Patent Application Publication 2014/0047993 (noted above).

After proper drying, the dry coverage of a single-layer negative-working radiation-sensitive imageable layer (especially those that are infrared radiation-sensitive) on an inventive aluminum-containing substrate can be at least 0.1 $g/m^2$ or at least 0.4 $g/m^2$, and up to and including 2 $g/m^2$ or up to and including 4 $g/m^2$ but other dry coverage amounts can be used if desired.

For single-layer positive-working lithographic printing plate precursors, the dry coverage of a single radiation-sensitive imageable layer can be generally at least 0.5 $g/m^2$ or at least 1 $g/m^2$ and up to and including 2 $g/m^2$ and up to and including 2.5 $g/m^2$, but other dry coverage amounts can be used if desired.

For dual-layer positive-working lithographic printing plate precursors, the dry coverage for an inner layer can be at least 0.2 $g/m^2$ or at least 0.5 $g/m^2$, and up to and including 2 $g/m^2$ or up to and including 2.5 $g/m^2$; and the dry coverage for an outer layer is generally at least 0.2 $g/m^2$ or at least 0.3 $g/m^2$, and up to and including 1 $g/m^2$ or up to and including 2 $g/m^2$ or at least 0.3 $g/m^2$. Other dry coverage amounts can be used if desired.

For negative-working lithographic printing plate precursors, the dry coverage for a radiation-sensitive imageable layer can be at least 0.1 $g/m^2$ or at least 0.4 $g/m^2$, and up to and including 2 $g/m^2$ or up to and including 4 $g/m^2$; and the dry coverage for a protective layer, when present, is generally at least 0.1 $g/m^2$ or at least 0.15 $g/m^2$, and up to and including 0.9 $g/m^2$ or up to and including 2.5 $g/m^2$. Other dry coverage amounts can be used if desired.

In practical manufacturing conditions, the result of these coating operations is a continuous web or roll of radiation-sensitive lithographic printing plate precursor material having either one or more radiation-sensitive imageable layers and any optional layers noted above disposed on the inventive aluminum-containing substrate described above.

Individual rectangular lithographic printing plate precursors are formed from this resulting continuous radiation-sensitive web or roll by slitting to create multiple longitudinal strips, each of which has a width equal to one dimension of rectangular lithographic printing plate precursors. A cutting-to-length process is used to create a lateral cut across each strip at an interval equal to the other dimension of rectangular lithographic printing plate precursors, thereby forming individual precursors having a square or rectangular shape.

Imaging (Exposing) Conditions

During use, a radiation-sensitive lithographic printing plate precursor of this invention can be exposed to a suitable source of exposing radiation depending upon the radiation absorber (or sensitizer) present in the one or more radiation-sensitive imageable layers. For example, most negative-working and all positive-working lithographic printing plate precursors can be imaged with infrared radiation-emitting lasers (for example in a system of diode lasers) that emit significant radiation within the range of at least 750 nm and up to and including 1400 nm, or of at least 800 nm and up to and including 1250 nm. Some negative-working lithographic printing plate precursors can be imaged in the UV, "violet," or visible regions of the electromagnetic spectrum using suitable sources of imaging radiation (for example, from 250 nm and less than 750 nm) using suitable lasers. This imagewise exposure results in exposed regions and non-exposed regions in the one or more radiation-sensitive imageable layers.

Imaging can be carried out using imaging or exposing radiation from a radiation-generating laser (or array of such lasers). Imaging also can be carried out using imaging radiation at multiple wavelengths at the same time if desired, for example, using multiple infrared radiation wavelengths. The laser(s) used to expose the precursor is usually a diode laser(s), because of the reliability and low maintenance of diode laser systems, but other lasers such as gas or solid-state lasers can also be used. The combination of power, intensity and exposure time for radiation imaging would be readily apparent to one skilled in the art.

The imaging apparatus can be configured as a flatbed recorder or as a drum recorder, with the radiation-sensitive lithographic printing plate precursor mounted to the interior or exterior cylindrical surface of the drum. An example of useful infrared imaging apparatus is available as models of KODAK® Trendsetter platesetters (Eastman Kodak Company) and NEC AMZISetter X-series (NEC Corporation, Japan) that contain laser diodes that emit radiation at a wavelength of about 830 nm. Other suitable infrared imaging apparatus includes the Screen PlateRite 4300 series or 8600 series platesetters (available from Screen USA, Chicago, Ill.) or thermal CTP platesetters from Panasonic Corporation (Japan) that operate at a wavelength of 810 nm.

Infrared radiation imaging intensities can be at least 30 mJ/cm$^2$ and up to and including 500 mJ/cm$^2$ and typically at least 50 mJ/cm$^2$ and up to and including 300 mJ/cm$^2$ depending upon the sensitivity of the infrared radiation-sensitive imageable layer.

Useful UV and "violet" imaging apparatus include those machines marketed as ProSetter (Heidelberger Druckmaschinen, Germany), Luxel V8/V6 series (Fuji, Japan), Python (Highwater, UK), Mako News, Mako 2, and Mako 8 (ECRM, US), Micro (Screen, Japan), Polaris and Advantage (AGFA, Belgium), LS Jet (Multiformat) and Smart 'n' Easy Jet (Krause, Germany), and VMAX series (DotLine, Germany), imagesetters.

Imaging in the UV to visible region of the electromagnetic spectrum and particularly the UV region (250 nm to 450 nm) can be carried out using intensities of at least 0.01 mJ/cm$^2$ and up to and including 0.5 mJ/cm$^2$ at a power density of at least 0.5 kW/cm$^3$ and up to and including 50 kW/cm$^3$.

Processing (Development) and Printing

Exposed Positive-Working Precursors:

These precursors are typically processed off-press after exposure using a suitable developer and apparatus that are known in the art, for a time sufficient to remove the exposed regions of the one or more exposed radiation-sensitive imageable layers to reveal the hydrophilic outer surface of the inventive aluminum-containing substrate prepared according to the present invention, and leaving intact the non-exposed regions. Suitable developers, apparatus, conditions for processing, and any optional pre- or post-development treatments used would be readily apparent to one skilled in the art and some details of this type are described in U.S. Pat. No. 8,530,141 (Savariar-Hauck et al.), U.S. Pat. No. 8,632,940 (Hauck et al.), U.S. Pat. No. 8,647,811 (Chechik et al), U.S. Pat. No. 8,846,299 (Savariar-Hauck et al.), U.S. Pat. No. 8,936,899 (Hauck et al.), and U.S. Pat. No. 8,939,080 (Levanon et al.), the disclosures of all of which are incorporated herein by reference.

Printing using the imagewise exposed and processed positive-working lithographic printing plate precursors can be carried out using known printing presses, lithographic printing inks, fountain solutions, and printing conditions. Lithographic printing ink would be preferentially attracted to the remaining non-exposed regions on the lithographic printing surface of resulting lithographic printing plates and repelled by the hydrophilic surface of the inventive aluminum-containing substrate in the exposed regions.

Exposed Negative-Working Precursors:

After imagewise exposing, the exposed negative-working radiation-sensitive lithographic printing plate precursors having exposed regions and non-exposed regions in the radiation-sensitive imageable layer can be processed in a suitable manner to remove the non-exposed regions and any hydrophilic overcoat if present, and leaving intact the hardened exposed regions.

Processing can be carried out off-press using any suitable developer in one or more successive applications (treatments or developing steps) of the same or different processing solution (developer). Such one or more successive processing treatments can be carried out for a time sufficient to remove the non-exposed regions of the radiation-sensitive imageable layer to reveal the outermost hydrophilic surface of the inventive aluminum-containing substrate, but not long enough to remove significant amounts of the exposed regions that have been hardened in the same layer. During lithographic printing, the revealed hydrophilic surface of the inventive aluminum-containing substrate repels ink while the remaining exposed regions accept lithographic printing ink.

Prior to such off-press processing, the exposed precursors can be subjected to a "pre-heating" process to further harden the exposed regions in the radiation-sensitive imageable layer. Such optional pre-heating can be carried out using any known process and equipment generally at a temperature of at least 60° C. and up to and including 180° C.

Following this optional pre-heating, or in place of the pre-heating, the exposed precursor can be washed (rinsed) to remove any hydrophilic overcoat that is present. Such optional washing (or rinsing) can be carried out using any suitable aqueous solution (such as water or an aqueous solution of a surfactant) at a suitable temperature and for a suitable time that would be readily apparent to one skilled in the art.

Useful developers can be ordinary water or formulated aqueous solutions. The formulated developers can comprise one or more components selected from surfactants, organic solvents, alkali agents, and surface protective agents. For example, useful organic solvents include the reaction products of phenol with ethylene oxide and propylene oxide [such as ethylene glycol phenyl ether (phenoxyethanol)], benzyl alcohol, esters of ethylene glycol and of propylene glycol with acids having 6 or less carbon atoms, and ethers of ethylene glycol, diethylene glycol, and of propylene glycol with alkyl groups having 6 or less carbon atoms, such as 2-ethylethanol and 2-butoxyethanol.

In some instances, an aqueous processing solution can be used off-press to both develop the imaged precursor by removing the non-exposed regions and also to provide a protective layer or coating over the entire imaged and developed (processed) precursor printing surface. In this embodiment, the aqueous solution behaves somewhat like a gum that is capable of protecting (or "gumming") the lithographic image on the printing plate against contamination or damage (for example, from oxidation, fingerprints, dust, or scratches).

After the described off-press processing and optional drying, the resulting lithographic printing plate can be mounted onto a printing press without any contact with additional solutions or liquids. It is optional to further bake the lithographic printing plate with or without blanket or flood-wise exposure to UV or visible radiation.

Printing can be carried out by applying a lithographic printing ink and fountain solution to the printing surface of the lithographic printing plate in a suitable manner. The fountain solution is taken up by the hydrophilic surface of the inventive substrate revealed by the exposing and processing steps, and the lithographic ink is taken up by the remaining (exposed) regions of the radiation-sensitive imageable layer. The lithographic ink is then transferred to a suitable receiving material (such as cloth, paper, metal, glass, or plastic) to provide a desired impression of the image thereon. If desired, an intermediate "blanket" roller can be used to transfer the lithographic ink from the lithographic printing plate to the receiving material (for example, sheets of paper).

Some details concerning off-press processing of imagewise exposed negative-working lithographic printing plates are provided, for example, in U.S. Pat. No. 8,507,182 (Figov et al.), U.S. Pat. No. 8,530,141 (noted above), U.S. Pat. No. 8,632,940 (noted above), U.S. Pat. No. 8,632,941 (Balbinot et al.), and U.S. Pat. No. 8,889,341 (Werner et al.), the disclosures of all of which are incorporated herein by reference.

On-Press Development and Printing:

The negative-working lithographic printing plate precursors of the present invention can be designed to be on-press developable. On-press development can be carried out using a lithographic printing ink, a fountain solution, or a combination of a lithographic printing ink and a fountain solution. In such embodiments, an imaged negative-working, infrared radiation-sensitive lithographic printing plate precursor according to the present invention is mounted onto a printing press and the printing operation is begun. The non-exposed regions in the negative-working, infrared radiation-sensitive imageable layer are removed by a suitable fountain solution, lithographic printing ink, or a combination of both, when the initial printed impressions are made. Typical ingredients of aqueous fountain solutions include pH buffers, desensitizing agents, surfactants and wetting agents, humectants, low boiling solvents, biocides, antifoaming agents, and sequestering agents. A representative example of a fountain solution is Varn Litho Etch 142W+Varn PAR (alcohol sub) (available from Varn International, Addison, Ill.).

A suitable lithographic printing press can comprise a plate cylinder for holding an imaged lithographic printing plate precursor; an inking system capable of supplying lithographic printing ink to the imaged surface of the imaged lithographic printing plate precursor; a dampening system capable of supplying fountain solution to the imaged surface; a blanket cylinder capable of transferring the lithographic printing ink from the imaged lithographic printing plate precursor; an impression cylinder capable of pressing one or more printing papers (or other printable materials) onto the blanket cylinder, and thus transferring the lithographic printing ink from the blanket cylinder onto the one or more printing papers; and a printing paper feeding system for supplying the one or more printing papers to the impression cylinder. While the present invention is not limited to a specific model or commercially available lithographic printing press, some useful lithographic printing presses are commercially available as Heidelberg Speedmaster 74 and Speedmaster XL105 available from Heidelberg USA (1000 Gutenberg Drive, Kennesaw, Ga. 30144), KBA Rapida 105 available Koenig & Bauer (US) (2555 Regent Boulevard Dallas, Tex. 75261), Komori LITHRONE G40 available from Komori America (5520 Meadowbrook Industrial Court, Rolling Meadows, Ill. 60008). Illustrations of useful lithographic printing presses and their operation are described for example, in Chapter 12 of the book of "Printing Technology, the $4^{th}$ addition", by J. Michael Adams, David D. Faux, Lloyd J. Rieber, Delmar Publishers, Inc.

In a typical printing press startup with a sheet-fed printing machine, the dampening roller is engaged first and supplies fountain solution to the mounted imaged precursor to swell the imaged negative-working, infrared radiation-sensitive imageable layer at least in the non-exposed regions. After a few revolutions, the inking rollers are engaged, and they supply lithographic printing ink(s) to cover the entire printing surface of the imaged lithographic printing precursors. Typically, from 1 to 15 revolutions of the plate cylinder are carried out after the inking roller engagement, and printing sheets are supplied to remove non-exposed regions of the negative-working, infrared radiation-sensitive imageable layer from the lithographic printing plate as well as materials on a blanket cylinder if present, using the formed ink-fountain solution emulsion. The result is a fully developed, functioning lithographic printing plate as the printing press is operated beyond 15 revolutions of the plate cylinder. Thus, the fully developed lithographic printing plate has ink-accepting image regions that substantially correspond to the infrared radiation exposed regions, and non-ink-accepting hydrophilic non-image regions that substantially correspond to the infrared radiation non-exposed regions.

On-press developability of infrared radiation exposed lithographic printing precursors is particularly useful when the precursor comprises one or more (d) polymeric binders in an infrared radiation-sensitive imageable layer, at least one of which (d) polymeric binders can be present as particles having an average diameter of at least 50 nm and up to and including 400 nm.

The present invention provides at least the following embodiments and combinations thereof, but other combinations of features are considered to be within the present invention as a skilled artisan would appreciate from the teaching of this disclosure:

1. An aluminum-containing substrate comprising:

an aluminum-containing plate having a grained and etched surface;

an inner aluminum oxide layer over the grained and etched surface, the inner aluminum oxide layer having an average dry thickness ($T_i$) of at least 500 nm and up to and including 1,500 nm; and comprising a multiplicity of inner pores having an average inner pore diameter ($D_i$) of more than 0 nm but less than 15 nm;

a middle aluminum oxide layer over the inner aluminum oxide layer, the middle aluminum oxide layer having an average dry thickness ($T_m$) of at least 60 nm and up to and including 300 nm; comprising a multiplicity of middle pores having an average middle pore diameter ($D_m$) of at least 15 nm and up to and including 60 nm; and having a middle pore density ($C_m$) of at least 100 middle pores/$\mu m^2$ and up to and including 2,000 middle pores/$\mu m^2$; and an outer aluminum oxide layer over the middle aluminum oxide layer, the outer aluminum oxide layer having an average dry thickness ($T_o$) of at least 30 nm and up to and including 150 nm; comprising a multiplicity of outer pores having an average outer pore diameter ($D_o$) of at least 5 nm and up to and including 35 nm; and having an outer pore density ($C_o$) of at least 100 outer pores/$\mu m^2$ and up to and including 5,000 outer pores/$\mu m^2$;

wherein the dry thickness of the combination of the middle aluminum oxide layer and the outer aluminum oxide layer is at least 120 nm and up to and including 420 nm, and wherein $D_m$ is larger than $D_o$ that is larger than $D_i$, and optionally, a hydrophilic layer comprising one or more hydrophilic polymers provided at a dry coverage of at least 0.0002 g/m$^2$ and up to and including 0.1 g/m$^2$.

2. A lithographic printing plate precursor comprising:
an aluminum-containing substrate, and
a radiation-sensitive imageable layer disposed over the aluminum-containing substrate,
wherein the aluminum-containing substrate comprises:
an aluminum-containing plate having a grained and etched surface;
an inner aluminum oxide layer over the grained and etched surface, the inner aluminum oxide layer having an average dry thickness ($T_i$) of at least 500 nm and up to and including 1,500 nm; and comprising a multiplicity of inner pores having an average inner pore diameter ($D_i$) of more than 0 nm but less than 15 nm;
a middle aluminum oxide layer over the inner aluminum oxide layer, the middle aluminum oxide layer having an average dry thickness ($T_m$) of at least 60 nm and up to and including 300 nm; comprising a multiplicity of middle pores having an average middle pore diameter ($D_m$) of at least 15 nm and up to and including 60 nm; and having a middle pore density ($C_m$) of at least 100 middle pores/$\mu m^2$ and up to and including 2,000 middle pores/$\mu m^2$; and
an outer aluminum oxide layer over the middle aluminum oxide layer, the outer aluminum oxide layer having an average dry thickness ($T_o$) of at least 30 nm and up to and including 150 nm; comprising a multiplicity of outer pores having an average outer pore diameter ($D_o$) of at least 5 nm and up to and including 35 nm; and having an outer pore density ($C_o$) of at least 100 outer pores/$\mu m^2$ and up to and including 5,000 outer pores/$\mu m^2$;
wherein the dry thickness of the combination of the middle aluminum oxide layer and the outer aluminum oxide layer is at least 120 nm and up to and including 420 nm, and
wherein $D_m$ is larger than $D_o$ that is larger than $D_i$, and
optionally, a hydrophilic layer comprising one or more hydrophilic polymers provided at a dry coverage of at least 0.0002 g/m$^2$ and up to and including 0.1 g/m$^2$, 3. Embodiment 1 or 2 wherein the ratio of the outer pore density to the middle pore density ($C_o/C_m$) is at least 1.1:1.0.

4. Any of embodiments 1 to 3, wherein the ratio of the outer pore density to the middle pore density ($C_o/C_m$) is at least 1.5:1.0.

5. Any of embodiments 1 to 4, wherein the ratio of the outer pore density to the middle pore density ($C_o/C_m$) is at least 2.0:1.0.

6. Any of embodiments 1 to 5, wherein the outer aluminum oxide layer has an average dry thickness ($T_o$) of at least 40 nm and up to and including 140 nm.

7. Any of embodiments 1 to 6, wherein the inner aluminum oxide layer has an average dry thickness ($T_i$) of at least 550 nm and up to and including 1,000 nm.

8. Any of embodiments 1 to 7, wherein the middle aluminum oxide layer has an average dry thickness ($T_m$) of at least 70 nm and up to and including 280 nm.

9. Any of embodiments 1 to 8, further characterized wherein:
the porosity ($P_m$) of the middle aluminum oxide layer is defined according to the following equation:

$$0.15 \leq P_m \leq 0.65$$

wherein $P_m$ is defined as $3.14(C_m)(D_m^2)/4,000,000$, and
the porosity ($P_o$) of the outer aluminum oxide layer is defined according to the following equation:

$$0.30 \leq P_o \leq 0.80$$

wherein $P_o$ is defined as $3.14(C_o)(D_o^2)/4,000,000$.

10. Any of embodiments 1 to 9, further characterized wherein:
the porosity ($P_m$) of the middle aluminum oxide layer is defined according to the following equation:

$$0.15 \leq P_m \leq 0.55$$

wherein $P_m$ is defined as $3.14(C_m)(D_m^2)/4,000,000$, and
the porosity ($P_o$) of the outer aluminum oxide layer is defined according to the following equation:

$$0.40 \leq P_o \leq 0.75$$

wherein $P_o$ is defined as $3.14(C_o)(D_o^2)/4,000,000$.

11. Any of embodiments 1 to 10, wherein $D_o$ is at least 10 nm and up to and including 30 nm.

12. Any of embodiments 1 to 11, wherein $D_m$ is at least 17 nm and up to and including 55 nm.

13. Any of embodiments 1 to 12, further comprising the hydrophilic layer that comprises one or more water-soluble polymers.

14. Any of embodiments 1 and 3 to 13, which is in roll form.

15. Any of embodiments 2 to 14, wherein the radiation-sensitive imageable layer is sensitive to infrared radiation and comprises one or more infrared radiation absorbers.

16. Embodiment 15, wherein the radiation-sensitive imageable layer is positive-working and comprises one or more alkali-soluble polymers that are removable from the substrate upon exposure to radiation.

17. Embodiment 15, wherein the radiation-sensitive imageable layer is negative-working and comprises:
(a) one or more free radically polymerizable components;
(b) an initiator composition that provides free radicals upon exposure of the radiation-sensitive imageable layer to radiation;
(c) the one or more infrared radiation absorbers; and optionally,
(d) a polymeric binder that is different from all of (a), (b), and (c).

18. Any of embodiments 2 to 15, and 17, wherein the radiation-sensitive layer is negative-working and is on-press developable.

19. Embodiment 18, wherein the radiation-sensitive layer further comprises the (d) polymeric binder that is in particulate form.

20. Any of embodiments 17 to 19 that is negative-working and further comprises a hydrophilic overcoat disposed over the radiation-sensitive imageable layer.

21. A method for providing a lithographic printing plate, comprising:
imagewise exposing the lithographic printing plate precursor of any of embodiments 2 to 20 to imaging radiation to form an imagewise exposed imageable layer having exposed regions and non-exposed regions, and
removing either the exposed regions or the non-exposed regions, but not both exposed regions and non-exposed regions, from the imagewise exposed imageable layer, to form a lithographic printing plate.

22. The method of embodiment 21, wherein the non-exposed regions in the imagewise exposed imageable layer are removed.

23. The method of embodiment 22, wherein the non-exposed regions in the imagewise exposed imageable layer are removed on-press using a lithographic printing ink, a fountain solution, or both the lithographic printing ink and the fountain solution.

24. The method of any of embodiments 21 to 23, wherein the imagewise exposing is carried out using infrared radiation.

25. A method for preparing the lithographic printing plate precursor of any of embodiments 2 to 20, the method comprising, in order:

A) providing an aluminum-containing plate having an electrochemically or mechanically grained and etched surface;

B) subjecting the aluminum-containing plate to a first anodizing process using phosphoric acid to form an outer aluminum oxide layer over the electrochemically or mechanically grained and etched surface, the outer aluminum oxide layer having an average dry thickness ($T_o$) of at least 30 nm and up to and including 150 nm; comprising a multiplicity of outer pores having an average outer micropore diameter ($D_o$) of at least 5 nm and up to and including 35 nm; and having an outer pore density ($C_o$) of at least 100 outer pores/$\mu m^2$ and up to and including 5,000 outer pores/$\mu m^2$;

C) optionally, rinsing the outer aluminum oxide layer;

D) subjecting the aluminum-containing plate to a second anodizing process using phosphoric acid to form a middle aluminum oxide layer underneath the outer aluminum oxide layer, the middle aluminum oxide layer having an average dry thickness ($T_m$) of at least 60 nm and up to and including 300 nm; comprising a multiplicity of middle pores having an average middle pore diameter ($D_m$) of at least 15 nm and up to and including 60 nm; and having a middle pore density ($C_m$) of at least 100 middle pores/$\mu m^2$ and up to and including 2,000 middle pores/$\mu m^2$;

E) optionally, rinsing the middle aluminum oxide layer;

F) subjecting the aluminum-containing plate to a third anodizing process using sulfuric acid to form an inner aluminum oxide layer underneath the middle aluminum oxide layer, the inner aluminum oxide layer having an average dry thickness ($T_i$) of at least 500 nm and up to and including 1,500 nm; and comprising a multiplicity of inner pores having an average inner pore diameter ($D_i$) of more than 0 nm but less than 15 nm, to form an aluminum-containing substrate, wherein $D_m$ is larger than $D_o$ that is larger than $D_i$ and wherein the dry thickness of the combination of the middle aluminum oxide layer and the outer aluminum oxide layer is at least 120 nm and up to and including 420 nm;

G) optionally, rinsing the inner aluminum oxide layer;

H) optionally, applying a hydrophilic composition comprising one or more hydrophilic polymers to provide a dry coverage of at least 0.0002 g/$m^2$ and up to and including 0.1 g/$m^2$; and I) disposing a radiation-sensitive imageable layer over the aluminum-containing substrate.

The following Examples are provided to illustrate the practice of this invention and are not meant to be limiting in any manner.

Invention Examples 1-16

Inventive aluminum-containing substrates used in Invention Examples 1-16 were prepared according to the general processes described above. Hydro 1052 aluminum alloy strip or web (available from Norsk Hydro ASA, Norway) having a thickness of 0.28 mm was used as the aluminum-containing "plate" stock or support. Both pre-etch and post-etch steps were carried out in alkaline solutions under known conditions. Roughening (or graining) was carried out by electrochemical means in a hydrochloric acid solution at about 23° C. to obtain an arithmetic average roughness (Ra) of 0.36 µm on a surface of the aluminum-containing support. These treatment steps were carried out in a continuous process on a typical manufacturing line used to manufacture lithographic printing plate precursors. The resulting grained and etched aluminum-containing support was then rinsed with water, dried, and cut into individual grained and etched aluminum-containing sheets. Each individual sheet was then anodized three times in individual and sequential anodizing processes, each anodizing process bath containing about 100 liters of anodizing solution. The first, second, and third anodizing conditions for each of the Invention Examples 1-16 are shown below in TABLE I. The first anodizing process to form the outer aluminum oxide layer and the second anodizing process to form the middle aluminum oxide layer were carried out using phosphoric acid as the electrolyte, and the third anodizing process to form the inner aluminum oxide layer was carried out using sulfuric acid as the electrolyte.

TABLE I

Conditions for First and Second Anodizing Processes

| | First Anodizing Treatment (Outer Al Oxide Layer) | | | | | Second Anodizing Treatment (Middle Al Oxide Layer) | | | | |
|---|---|---|---|---|---|---|---|---|---|---|
| Invention Example | $H_3PO_4$ conc. [g/l] | Temperature [° C.] | Current density [A/$dm^2$] | Time [s] | Charge density [C/$dm^2$] | $H_3PO_4$ conc. [g/l] | Temperature [° C.] | Current density [A/$dm^2$] | Time [s] | Charge density [C/$dm^2$] |
| 1 | 150 | 50 | 3.0 | 14 | 42 | 150 | 45 | 3.2 | 42 | 134 |
| 2 | 150 | 40 | 1.5 | 29 | 44 | 150 | 40 | 1.5 | 59 | 89 |
| 3 | 150 | 50 | 3.0 | 14 | 42 | 150 | 45 | 3.2 | 42 | 134 |
| 4 | 150 | 45 | 2.1 | 20 | 42 | 150 | 50 | 4.6 | 29 | 133 |
| 5 | 150 | 50 | 2.7 | 14 | 38 | 150 | 45 | 2.0 | 42 | 84 |
| 6 | 150 | 55 | 3.7 | 15 | 56 | 150 | 40 | 2.2 | 34 | 75 |
| 7 | 150 | 60 | 4.8 | 13 | 62 | 150 | 50 | 4.4 | 17 | 75 |
| 8 | 150 | 55 | 3.3 | 15 | 50 | 150 | 45 | 3.1 | 24 | 74 |
| 9 | 150 | 55 | 2.9 | 15 | 44 | 150 | 40 | 2.2 | 34 | 75 |
| 10 | 150 | 50 | 2.2 | 26 | 57 | 150 | 40 | 2.2 | 34 | 75 |
| 11 | 150 | 55 | 2.7 | 19 | 51 | 150 | 40 | 2.2 | 34 | 75 |
| 12 | 150 | 50 | 2.4 | 14 | 34 | 150 | 45 | 2.1 | 42 | 88 |
| 13 | 150 | 50 | 2.4 | 14 | 34 | 150 | 40 | 2.2 | 34 | 75 |

TABLE I-continued

| 14 | 150 | 50 | 3.0 | 14 | 42 | 150 | 45 | 1.1 | 42 | 46 |
| 15 | 150 | 60 | 5.9 | 13 | 77 | 150 | 50 | 4.9 | 29 | 142 |
| 16 | 150 | 65 | 5.9 | 14 | 83 | 150 | 45 | 3.2 | 42 | 134 |

(Continued) Conditions for Third Anodizing Processes

| | Third Anodizing Treatment (Inner Al Oxide Layer) | | | | |
| --- | --- | --- | --- | --- | --- |
| Invention Example | $H_2SO_4$ conc. [g/l] | Temperature [° C.] | Current density [A/dm$^2$] | Time [s] | Charge density [C/dm$^2$] |
| 1 | 280 | 35 | 3.5 | 50 | 175 |
| 2 | 280 | 35 | 3.5 | 50 | 175 |
| 3 | 280 | 35 | 3.5 | 50 | 175 |
| 4 | 280 | 35 | 2.3 | 50 | 115 |
| 5 | 280 | 35 | 3.5 | 50 | 175 |
| 6 | 280 | 35 | 3.5 | 50 | 175 |
| 7 | 280 | 35 | 3.5 | 50 | 175 |
| 8 | 280 | 35 | 3.5 | 50 | 175 |
| 9 | 280 | 35 | 3.5 | 50 | 175 |
| 10 | 280 | 35 | 3.5 | 50 | 175 |
| 11 | 280 | 35 | 3.5 | 50 | 175 |
| 12 | 280 | 35 | 3.5 | 50 | 175 |
| 13 | 280 | 35 | 3.5 | 50 | 175 |
| 14 | 280 | 35 | 3.5 | 50 | 175 |
| 15 | 280 | 35 | 3.5 | 50 | 175 |
| 16 | 280 | 35 | 3.5 | 50 | 175 |

The pore structure of each aluminum oxide layer provided by the first, second, and third anodizing processes was evaluated by FE-SEM microscopy, performed on a Hitachi S4100 with a magnification of 50,000× to 150,000×. Top view SEM micrographs were taken perpendicularly to the outer surface of the anodized aluminum-containing substrate. Cross-sectional SEM micrographs were taken parallel to the outer surface of the substrate by bending a small sample of each substrate by 180° and inspecting the breaking edge. The dry average layer thickness of each of the inner, middle, and outer aluminum oxide layers, $T_i$, $T_m$, and $T_o$, respectively, was measured from several cross-sectional images and the dry average layer thickness is shown below in TABLE II for each Invention Example substrate.

The inner pore diameters ($D_i$) of the inner aluminum oxide layer in the aluminum-containing substrate were estimated from the cross-sectional SEM micrographs. Additionally, it was observed from cross-sectional view SEM micrographs that the inner pore diameter ($D_i$) did not change significantly within the depth of the inner aluminum oxide layer. The outer pore diameters ($D_o$) of the outer aluminum oxide were estimated from the top view SEM micrographs. An average outer pore diameter ($D_o$) was determined from 200 pores in three top view SEM micrographs taken at different sample positions. Additionally, it was observed from cross-sectional view SEM micrographs that the outer pore diameter ($D_o$) did not change significantly within the depth of the outer aluminum oxide layer. In the same way, the average middle pore diameters ($D_m$) of the middle aluminum oxide layer were estimated from 200 pores in three top view SEM micrographs taken at different sample positions after removing the outer aluminum oxide layer by a sputtering treatment where the sputter beam ($Ar^+$ ions) was directed at a sample of the inventive aluminum-containing substrate at an angle of 45° relative to the surface normal for a sufficient period of time. The sputtering treatment was repeated three times each after rotating the inventive aluminum-containing substrate sample by 90° to achieve an even removal across the surface in the SEM viewing area. Additionally, it was observed from cross-sectional view SEM micrographs that the middle pore diameter ($D_m$) did not change significantly within the depth of the middle aluminum oxide layer.

The outer pore density ($C_o$) of the outer aluminum oxide layer was determined by counting the pores per projected surface area of the inventive aluminum-containing substrate in the top view SEM micrographs. The porosity of the outer aluminum oxide layer is defined as the area in the top view SEM micrographs covered by pores relative to the projected surface area parallel to the inventive aluminum-containing substrate outermost surface. In the same way, the middle pore density ($C_m$) of the middle aluminum oxide layer was determined by counting the pores per projected surface area of the inventive aluminum-containing substrate in the top view SEM micrographs after removing the outer aluminum oxide layer by a sputtering treatment (as described before).

TABLE II

Structural Features of the Outer and Middle Aluminum Oxide Layers

| | Outer Aluminum Oxide Layer | | | | Middle Aluminum Oxide Layer | | | |
|---|---|---|---|---|---|---|---|---|
| Invention Example | Outer Layer Average Dry Thickness ($T_o$) [nm] | Outer Layer Average Pore Diameter ($D_o$) [nm] | Outer Layer Pore Density ($C_o$) | Outer Layer Porosity ($P_o$) | Middle Layer Average Dry Thickness ($T_m$) [nm] | Middle Layer Average Pore Diameter ($D_m$) [nm] | Middle Layer Pore Density ($C_m$) | Middle Layer Porosity ($P_m$) |
| 1 | 63 | 19.8 | 1670 | 0.51 | 232 | 24.8 | 608 | 0.29 |
| 2 | 64 | 19.7 | 1650 | 0.50 | 151 | 22.9 | 733 | 0.30 |
| 3 | 66 | 19.9 | 1670 | 0.52 | 232 | 27.0 | 520 | 0.30 |
| 4 | 68 | 19.8 | 1690 | 0.52 | 233 | 27.2 | 518 | 0.30 |
| 5 | 60 | 18.9 | 2040 | 0.57 | 140 | 22.9 | 730 | 0.30 |
| 6 | 87 | 18.9 | 1670 | 0.47 | 127 | 21.0 | 730 | 0.25 |
| 7 | 97 | 19.7 | 1680 | 0.51 | 130 | 21.5 | 735 | 0.27 |
| 8 | 78 | 18.0 | 2040 | 0.52 | 126 | 21.4 | 735 | 0.26 |
| 9 | 68 | 17.1 | 2620 | 0.60 | 129 | 20.8 | 730 | 0.25 |
| 10 | 88 | 18.8 | 2050 | 0.57 | 135 | 20.7 | 740 | 0.25 |
| 11 | 77 | 18.0 | 2650 | 0.67 | 123 | 20.4 | 750 | 0.25 |
| 12 | 53 | 18.0 | 2630 | 0.67 | 141 | 22.8 | 730 | 0.30 |
| 13 | 53 | 14.9 | 3980 | 0.69 | 125 | 20.8 | 730 | 0.25 |
| 14 | 66 | 19.8 | 1680 | 0.52 | 74 | 22.9 | 735 | 0.30 |
| 15 | 121 | 25.3 | 950 | 0.48 | 245 | 27.2 | 515 | 0.30 |
| 16 | 130 | 24.5 | 1560 | 0.74 | 235 | 24.6 | 610 | 0.29 |

TABLE II

Continued, Structural Features of the Inner Aluminum Oxide Layer

| Invention Example | Inner Layer Average Dry Thickness ($T_i$) [nm] | Inner Layer Average Pore Diameter ($D_i$) [nm] | $T_o + T_m$ [nm]* |
|---|---|---|---|
| 1 | 819 | <10 | 298 |
| 2 | 792 | <10 | 219 |
| 3 | 804 | <10 | 303 |
| 4 | 568 | <10 | 304 |
| 5 | 835 | <10 | 205 |
| 6 | 834 | <10 | 218 |
| 7 | 831 | <10 | 230 |
| 8 | 842 | <10 | 208 |
| 9 | 809 | <10 | 203 |
| 10 | 830 | <10 | 226 |
| 11 | 850 | <10 | 205 |
| 12 | 832 | <10 | 198 |
| 13 | 840 | <10 | 181 |
| 14 | 845 | <10 | 144 |
| 15 | 852 | <10 | 371 |
| 16 | 825 | <10 | 368 |

*Includes any aluminum oxide transition phase between the two aluminum oxide layers Each of the grained, etched, and anodized aluminum-containing substrates thus obtained was further treated (sometimes known as "post-anodic treatment") to provide a hydrophilic layer using a formulation having the components shown in the following TABLE III, which was applied using a bar coater; dried at 120° C. for 40 seconds; and then cooled to 20-27° C., resulting in a hydrophilic layer dry coverage of 0.03 g/m². No silicate treatment was used in these examples.

TABLE III

Hydrophilic Layer Formulation

| Component | Amount [g] |
|---|---|
| Polyacrylic acid (PAA) aqueous solution (40 weight %) (obtained as Jurymer AC-10S, marketed by TOAGOSEI) | 3.0 |
| Water | 27.0 |

Negative-working lithographic printing plate precursors were prepared according to the present invention using the aluminum-containing substrates of Invention Examples 1-16 by coating them with a negative-working, infrared radiation-sensitive imageable layer formulation having the components described below in TABLES IV and V, using a bar coater to provide a dry coating weight of negative-working, infrared radiation-sensitive imageable layer of 0.9 g/m² after drying at 50° C. for 60 seconds.

TABLE IV

Components of IR Radiation-Sensitive Imageable Layer Formulation

| Component | Amount [g] |
|---|---|
| Polymer dispersion | 0.747 |
| Hydroxypropyl methyl cellulose | 0.400 |
| Monomer 1 | 0.333 |
| Monomer 2 | 0.167 |
| IR dye 1 | 0.020 |
| Leuco Dye 1 | 0.023 |
| Surfactant 1 | 0.045 |
| Iodonium salt | 0.05 |
| 1-Propanol | 3.27 |

TABLE IV-continued

Components of IR Radiation-Sensitive Imageable Layer Formulation

| Component | Amount [g] |
|---|---|
| 2-Butanone | 1.60 |
| 1-Methoxy-2-propanol | 2.82 |
| δ-Butyrolactone | 0.10 |
| Water | 0.43 |

TABLE V

Description of Certain IR Radiation-Sensitive Imageable Layer Components

| | |
|---|---|
| Polymer dispersion | The polymer dispersion prepared according to Example 10 of EP 1,765,593A1, used as 23.5 weight % polymer in n-propanol/water at 80:20 weight ratio |
| Hydroxy propyl methyl cellulose | 5 weight % hydroxypropyl methyl cellulose polymer in water; the polymer is one where 30 mol % of the cellulosic hydroxy groups are converted into methoxy groups and 10 mol % of the cellulosic hydroxy groups are converted to hydroxypropoxy groups. and has a viscosity of 5 mPa-s in a 2 weight % aqueous solution at 20° C. |
| Monomer 1 | Urethane acrylate prepared by reacting DESMODUR® N100 (from Bayer Corp., Milford, CT) with hydroxyethyl acrylate and pentaerythritol triacrylate at approximately 1:1.5:15 molar ratio (40 weight % in 2-butanone). |
| Monomer 2 | Ethoxylated (10 EO) Bisphenol A acrylate, 40 weight % in 2-butanone |

IR dye 1

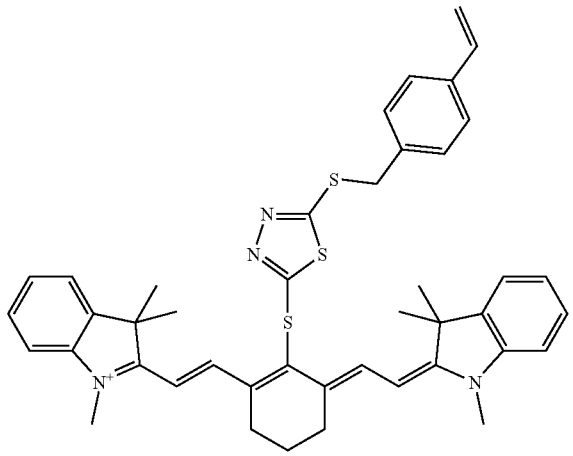

Leuco dye 1

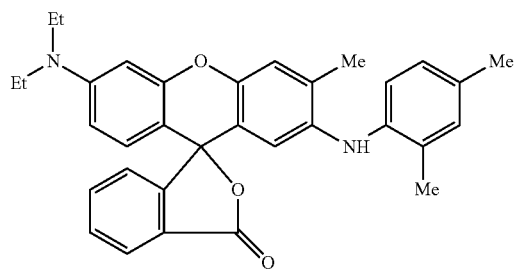 [SMILES: CCN(CC)c1ccc2c(c1)Oc1cc(C)c(Nc3ccc(C)cc3C)cc1C21OC(=O)c2ccccc21]

Iodonium salt   A tetraphenyl borate salt having the following cation:

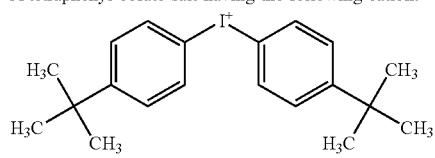

Surfactant 1   BYK® 302 from Byk Chemie, used as a 25 weight % solution in 1-methoxy-2-propanol Each of the resulting inventive lithographic printing plate precursors was evaluated with respect to press life, on-press developability, ink water balance (restart toning test) and scratch resistance using the test methods described below and the results are shown below in TABLE VI.

Press Life Evaluation:

To evaluate press life, each lithographic printing plate precursor was imagewise exposed using a Trendsetter 800 III Quantum (available from Eastman Kodak Company) at 120 mJ/cm$^2$ and then mounted on a Heidelberg Speedmaster SM 74 printing press (available from Heidelberg) without any development process in between. In other words, each was developed on-press using the printing press that was operated with Varn Supreme 6038+Par fountain solution and OF Kodak Kreide black lithographic printing ink (Jänecke+Schneemann Druckfarben GmbH). The press life printing test was performed up to 150,000 impressions with each resulting lithographic printing plate. With ongoing printing, the lithographic printing plates were gradually abraded.

The "press life" for each lithographic printing plate is defined as the number of printed paper sheets before the tonal value of the printed paper sheets in a 50% FM20 screen had been reduced to 70% or less of the tonal value obtained on the 1000$^{th}$ sheet. For the measurement of tonal values, a Techkon Spectro Dens spectral densitometer was used, and the results were scored as follows:

A: equal to or more than 80,000 sheets
B: equal to or more than 60,000 sheets, but less than 80,000 sheets
C: equal to or more than 40,000 sheets, but less than 60,000 sheets
D: equal to or more than 20,000 sheets, but less than 40,000 sheets
E: equal to or more than 10,000 sheets, but less than 20,000 sheets
F: less than 10,000 sheets On-Press Developability:

On-press developability was evaluated under the same exposure and printing press conditions as for the press life test, but only the first 1000 printed sheets were evaluated for each lithographic printing plate, and each precursor was exposed in segments at different energies of between 50 mJ/cm$^2$ and 300 mJ/cm$^2$ instead of 120 mJ/cm$^2$ on the full printing plate. On the first 10 revolutions, the printing press was operated only with fountain solution, and afterwards lithographic ink was supplied to the lithographic printing plates and printing paper was fed to the machine. During the on-press development process, the non-exposed regions of the radiation-sensitive imageable layer initially transferred lithographic ink to printed sheets. On-press development was finished when the lithographic ink density on the printed sheets in the non-exposed regions (corresponding to the non-image regions) became invisible to the naked eye and was scored as follows:

A: development finished with 5 or fewer sheets of paper;
B: development finished with more than 5 sheets, but 10 or fewer sheets of paper;
C: development finished with more than 10 sheets, but 15 or fewer sheets of paper;
D: development finished with more than 15 sheets, but 30 or fewer sheets of paper;
E: development finished with more than 30 sheets, but 50 or fewer sheets of paper;
F: not developable on press within 50 sheets of paper.

Scratch Resistance:

To assess scratch resistance, a heavy duty scouring pad (marketed for household cleaning) was placed under a weight with a circular shape having a diameter of 50 mm, and pulled at a constant speed of 0.2 m/s across the negative-working radiation-sensitive imageable layer side of each lithographic printing plate precursor cut into a rectangular shape of 600 mm×200 mm. The procedure was repeated on different regions of each lithographic printing plate precursor using weights that varied at 100 g, 300 g, 600 g, 900 g, and 1200 g. The precursors afterwards were dipped into a 100 ml CuSO$_4$ solution for 60 seconds at 20° C., in which the CuSO$_4$ reacted with the bare aluminum metal exposed in the scratches, rendering them a brownish color. The CuSO$_4$ solution was obtained by dissolving 151 g of CuSO$_4$*5H$_2$O in 800 ml of 1.0 molar HCl and then diluting the resulting solution with an equal amount of deionized water. Each lithographic printing plate precursor treated in this manner was visually assessed and the total number of individual brownish scratches was determined, where 10 or less scratches in one run with one of the weights were recorded as the actual count and more than 10 scratches in one run with one of the weights were counted as "20". The following scoring method was used in the evaluation:

A: less than 30 scratches;
B: equal to or more than 30 scratches but less than 40 scratches;
C: equal to or more than 40 scratches but less than 50 scratches;
D: equal to or more than 50 scratches but less than 60 scratches;
E: equal to or more than 60 scratches but less than 70 scratches;
F: equal to or more than 70 scratches.

Restart Toning Test:

To evaluate restart toning, the same exposure conditions as described for the press life test were applied. The samples of exposed lithographic printing plates were mounted on a SpeedMaster SX 52 printing press and developed on press using Böttcher fount S-3021 fountain solution and OF Kodak Kreide black lithographic printing ink (Jänecke+Schneemann Druckfarben GmbH). After 3,000 impressions, the printing press was stopped without post-dampening. After 15 minutes, the restart toning was tested without pre-dampening of the printing plates. For the restart toning test, the water content was operated close to the smearing limit to enhance the differentiation in restart toning. The printed sheets were evaluated by using a large format scanner and the subsequent analysis of the brightness in specific areas. A non-image area and a 20 µm checkerboard were analyzed. When the brightness in the specified area reached the maximum value, the plate was rated as clean and the results were scored as follows:

A: less than 20 sheets;
B: equal to or more than 20 sheets, but less than 30 sheets;
C: equal to or more than 30 sheets, but less than 40 sheets;
D: equal or more than 40 sheets, but less than 50 sheets;
E: equal or more than 50 sheets, but less than 60 sheets;
F: equal or more than 60 sheets.

TABLE VI

Evaluations of Invention Precursors

| Invention Example | Press Life | On-press Developability | Scratch Resistance | Restart Toning |
|---|---|---|---|---|
| 1 | B | A | A | B |
| 2 | B | A | A | A |
| 3 | B | A | A | A |
| 4 | C | A | B | A |

TABLE VI-continued

Evaluations of Invention Precursors

| Invention Example | Press Life | On-press Developability | Scratch Resistance | Restart Toning |
|---|---|---|---|---|
| 5 | A | A | A | A |
| 6 | A | A | A | B |
| 7 | A | A | A | C |
| 8 | B | A | A | B |
| 9 | B | A | A | A |
| 10 | A | A | A | B |
| 11 | B | A | A | A |
| 12 | A | A | A | A |
| 13 | D | A | A | A |
| 14 | D | A | A | A |
| 15 | A | B | A | D |
| 16 | A | C | A | D |

The results shown in TABLE VI show that the aluminum-containing substrates used in the precursors of Invention Examples 1-16 provided excellent press life, fast on-press developability, excellent ink water balance during press restarts, and good scratch resistance. The precursors constructed with an inner aluminum oxide layer in the aluminum-containing substrate, having an inner pore diameter ($D_i$) of less than 15 nm and an inner layer thickness ($T_i$) of at least 550 nm showed overall good scratch resistance. When the inner layer thickness ($T_i$) was increased (>700 nm), the scratch resistance was further improved. The layer thicknesses of the outer aluminum oxide layer ($T_o$) and the middle aluminum oxide layer ($T_m$) also contributed to the scratch resistance, but to a lesser extent.

Effective on-press development was achieved when the average pore diameter of the outer aluminum oxide layer ($D_o$) was smaller than 24 nm and the outer layer thickness ($T_o$) was smaller than 150 nm. On-press development was even further improved when $T_o$ was less than 120 nm.

The ink-water balance during press restarts was excellent for precursors wherein the aluminum-containing substrate had pore diameters in the three aluminum oxide layers represented by the relationship $D_m > D_o > D_i$ and the outer aluminum oxide dry layer thickness ($T_o$) was below 120 nm and its outer pore diameter ($D_o$) was below 24 nm.

Good press life was achieved when the cumulative (sum) dry layer thickness of the outer aluminum oxide layer and the middle aluminum oxide layer ($T_o + T_m$), including any aluminum oxide transition phase between the two aluminum oxide layers, was larger than 120 nm and an inner aluminum oxide layer was present. Press life was excellent, if the cumulative dry layer thickness of the outer aluminum oxide layer and the middle aluminum oxide layer ($T_o + T_m$), including any aluminum oxide transition phase between the two aluminum oxide layers, was larger than 150 nm, the average outer pore diameter ($D_o$) of the outer aluminum oxide layer was larger than 15 nm and the thickness of the inner aluminum oxide layer ($T_i$) was larger than 600 nm.

Comparative Examples 1 to 10

Comparative lithographic printing plate aluminum-containing substrates and precursors below labeled as CE1 through CE10 were prepared in the same manner as described above for Invention Examples 1-16 except that the grained and etched substrates were anodized using the parameters described in the following TABLE VII. In order to show the benefits of the inventive aluminum-containing substrates, most of the aluminum-containing substrates of the Comparative Examples were designed to have only one or two aluminum oxide layers according to various prior art teachings. For example, the precursors used in CE1, CE5, CE6, and CE8 were constructed with an aluminum-containing substrate containing a single aluminum oxide layer, and the precursors used in CE2, CE3, CE4, and CE7 were constructed with an aluminum-containing substrate having two aluminum oxide layers. However, the precursors used in CE9 and CE10 were constructed with an aluminum-containing substrate having three aluminum oxide layers, but the combined features of those three aluminum oxide layers were outside the scope of the present invention.

TABLE VII

Process Parameters for Comparative Substrate Preparation

| | First Anodizing Process | | | | | Second Anodizing Process | | | | |
|---|---|---|---|---|---|---|---|---|---|---|
| Comparative Example | $H_3PO_4$ conc. [g/l] | Temperature [° C.] | Time [s] | Current density [A/dm$^2$] | Charge density [C/dm$^2$] | $H_3PO_4$ conc. [g/l] | Temperature [° C.] | Time [s] | Current density [A/dm$^2$] | Charge density [C/dm$^2$] |
| CE1 | | | | | | | | | | |
| CE2 | 150 | 50 | 14 | 3.0 | 42 | 150 | 45 | 42 | 3.2 | 134 |
| CE3 | 150 | 50 | 14 | 3.0 | 42 | | | | | |
| CE4 | 150 | 60 | 20 | 4.6 | 92 | | | | | |
| CE5 | 150 | 50 | 14 | 3.0 | 42 | | | | | |
| CE6 | 150 | 60 | 20 | 4.6 | 92 | | | | | |
| CE7 | | | | | | 150 | 45 | 42 | 3.0 | 126 |
| CE8 | | | | | | 150 | 40 | 59 | 2.1 | 124 |
| CE9 | 150 | 50 | 14 | 3.0 | 42 | 150 | 55 | 21 | 6.5 | 137 |
| CE10 | 150 | 60 | 20 | 5.2 | 104 | 150 | 55 | 21 | 6.9 | 145 |

| | Third Anodizing Process | | | | |
|---|---|---|---|---|---|
| Comparative Example | $H_2SO_4$ conc. [g/l] | Temperature [° C.] | Time [s] | Current density [A/dm$^2$] | Charge density [C/dm$^2$] |
| CE1 | 280 | 35 | 50 | 3.5 | 175 |
| CE2 | | | | | |
| CE3 | 280 | 35 | 50 | 3.5 | 175 |
| CE4 | 280 | 35 | 50 | 3.5 | 175 |

TABLE VII-continued

| Process Parameters for Comparative Substrate Preparation | | | | | |
|---|---|---|---|---|---|
| CE5 | | | | | |
| CE6 | | | | | |
| CE7 | 280 | 35 | 50 | 3.5 | 175 |
| CE8 | | | | | |
| CE9 | 280 | 35 | 35 | 1.6 | 56 |
| CE10 | 280 | 35 | 50 | 1.6 | 175 |

The lithographic printing plate substrates prepared and used to construct the precursors of CE1 through CE10 were evaluated using the same techniques described above for evaluating the inventive aluminum-containing substrates and precursors of Invention Examples 1-16 and the determined structural features are shown in the following TABLE VIII.

TABLE VIII

| | Structural Features of Middle and Outer Aluminum Oxide Layers | | | | | | | |
|---|---|---|---|---|---|---|---|---|
| Comparative Example | Outer Layer Average Dry Thickness ($T_o$) [nm] | Outer Layer Average Pore Diameter ($D_o$) [nm] | Outer Layer Pore Density ($C_o$) | Outer Layer Porosity [%] ($P_o$) | Middle Layer Average Dry Thickness ($T_m$) [nm] | Middle Layer Average Pore Diameter ($D_m$) [nm] | Middle Layer Pore Density ($C_m$) | Middle Layer Porosity [%] ($P_m$) |
| CE1 | | | | | | | | |
| CE2 | 65 | 19.8 | 1670 | 0.51 | 233 | 27.2 | 520 | 0.30 |
| CE3 | 64 | 14.9 | 1680 | 0.29 | | | | |
| CE4 | 145 | 20.1 | 1400 | 0.44 | | | | |
| CE5 | 66 | 14.9 | 1690 | 0.29 | | | | |
| CE6 | 150 | 20.1 | 1410 | 0.45 | | | | |
| CE7 | | | | | 220 | 22.7 | 730 | 0.30 |
| CE8 | | | | | 218 | 22.9 | 725 | 0.30 |
| CE9 | 62 | 19.8 | 1670 | 0.51 | 234 | 27.0 | 510 | 0.29 |
| CE10 | 162 | 26.8 | 1070 | 0.60 | 247 | 27.2 | 520 | 0.30 |

| | (continued) Structural Features of Inner Aluminum Oxide Layers | | |
|---|---|---|---|
| Comparative Example | $T_m + T_o$ [nm]* | Inner Layer Average Dry Thickness ($T_i$) [nm] | Inner Layer Average Pore Diameter ($D_i$) [nm] |
| CE1 | 0 | 826 | <10 |
| CE2 | 302 | | |
| CE3 | 64 | 833 | <10 |
| CE4 | 145 | 852 | <10 |
| CE5 | 66 | | |
| CE6 | 150 | | |
| CE7 | 220 | 826 | <10 |
| CE8 | 218 | | |
| CE9 | 299 | 300 | <10 |
| CE10 | 413 | 846 | <10 |

*Includes any aluminum oxide transition phase between the two aluminum oxide layers.

The comparative aluminum-containing substrates CE1 through CE10 described above were used to prepare the comparative precursors for CE1 through CE10 by applying the hydrophilic layer formulation and negative-working radiation-sensitive imageable layer formulation described above for Invention Examples 1-16. The resulting lithographic printing plate precursors were imagewise exposed (when appropriate) and evaluated using the same procedures and evaluation tests as described above for Invention Examples 1-16. The results of these evaluations are shown in the following TABLE IX

TABLE IX

Properties of Comparative Precursors

| Comparative Example | Press Life | On-press Developability | Scratch Resistance | Restart Toning |
|---|---|---|---|---|
| CE1 | F | A | A | A |
| CE2 | C | A | F | A |
| CE3 | F | A | A | B |
| CE4 | A | A | A | E |
| CE5 | F | A | F | B |
| CE6 | B | A | F | D |
| CE7 | A | E | A | F |
| CE8 | C | D | F | D |
| CE9 | C | A | E | A |
| CE10 | A | F | A | F |

The results shown in TABLE IX for Comparative Examples CE1-CE10 that are outside of the present invention reveal one or more disadvantages for each Comparative precursor over the results obtained from the Invention Examples 1-16 comprising inventive aluminum-containing substrates. The Comparative Examples showed unsatisfactory scratch resistance either because the inner aluminum oxide layer was omitted (CE2, CE5, CE6, and CE8), or the inner aluminum oxide layer was not thick enough (CE9).

Ink water balance during press restarts was not excellent for CE4 and CE6 through CE8, because the aluminum-containing substrate contained only an outer aluminum oxide layer or a middle aluminum oxide layer, but not both layers. When the outer aluminum oxide layer (medium pore diameter) was omitted, restart toning behavior became especially worse due to the large pore diameter of the middle aluminum oxide layer then being the outermost surface. The comparative precursors also exhibited unsatisfactory press life when the cumulative layer thickness of the outer and middle aluminum oxide layers ($T_m+T_o$), including any aluminum oxide transition phase between the two aluminum oxide layers, was below 120 nm (see CE1, CE3, and CE5). The develop-on-press ability became unsatisfactory when the outer aluminum oxide layer was omitted and thus, the middle aluminum oxide layer having larger pore diameters was exposed as the outermost aluminum surface (see CE7 and CE8).

The on-press developability of an aluminum-containing substrate having three aluminum oxide layers was also not excellent when the outer aluminum oxide layer was formed with an average pore diameter ($D_o$) larger than 24 nm and a thickness ($T_o$) larger than 150 nm (CE10).

The invention has been described in detail with particular reference to certain preferred embodiments thereof, but it will be understood that variations and modifications can be effected within the spirit and scope of the invention.

The invention claimed is:

1. An aluminum-containing substrate comprising:
   an aluminum-containing plate having a grained and etched surface;
   an inner aluminum oxide layer over the grained and etched surface, the inner aluminum oxide layer having an average dry thickness ($T_i$) of at least 500 nm and up to and including 1,500 nm; and comprising a multiplicity of inner pores having an average inner pore diameter ($D_i$) of more than 0 nm but less than 15 nm;
   a middle aluminum oxide layer over the inner aluminum oxide layer, the middle aluminum oxide layer having an average dry thickness ($T_m$) of at least 60 nm and up to and including 300 nm; comprising a multiplicity of middle pores having an average middle pore diameter ($D_m$) of at least 15 nm and up to and including 60 nm; and having a middle pore density ($C_m$) of at least 100 middle pores/$\mu m^2$ and up to and including 2,000 middle pores/$\mu m^2$; and
   an outer aluminum oxide layer over the middle aluminum oxide layer, the outer aluminum oxide layer having an average dry thickness ($T_o$) of at least 30 nm and up to and including 150 nm; comprising a multiplicity of outer pores having an average outer pore diameter ($D_o$) of at least 5 nm and up to and including 35 nm; and having an outer pore density ($C_o$) of at least 100 outer pores/$\mu m^2$ and up to and including 5,000 outer pores/$m^2$;
   wherein the dry thickness of the combination of the middle aluminum oxide layer and the outer aluminum oxide layer is at least 120 nm and up to and including 420 nm,
   wherein the ratio of the outer pore density to the middle pore density ($C_o/C_m$) is at least 1.1:1.0, and
   wherein $D_m$ is larger than $D_o$ that is larger than a, and
   optionally, a hydrophilic layer comprising one or more hydrophilic polymers provided at a dry coverage of at least 0.0002 g/m$^2$ and up to and including 0.1 g/m$_2$.

2. The aluminum-containing substrate of claim 1, wherein the outer aluminum oxide layer has an average dry thickness ($T_o$) of at least 40 nm and up to and including 140 nm.

3. The aluminum-containing substrate of claim 1, wherein the middle aluminum oxide layer has an average dry thickness ($T_m$) of at least 70 nm and up to and including 280 nm.

4. The aluminum-containing substrate of claim 1, further characterized wherein:
   the porosity ($P_m$) of the middle aluminum oxide layer is defined according to the following equation:

$$0.15 \leq P_m \leq 0.55$$

wherein $P_m$ is defined as $3.14(C_m)(D_m^2)/4,000,000$, and the porosity ($P_o$) of the outer aluminum oxide layer is defined according to the following equation:

$$0.40 \leq P_o \leq 0.75$$

wherein $P_o$ is defined as $3.14(C_o)(D_o^2)/4,000,000$.

5. The aluminum-containing substrate of claim 1, wherein $D_o$ is at least 10 nm and up to and including 30 nm.

6. The aluminum-containing substrate of claim 1, wherein $D_m$ is at least 17 nm and up to and including 55 nm.

7. The aluminum-containing substrate of claim 1, further comprising the hydrophilic layer that comprises one or more water-soluble polymers.

8. A lithographic printing plate precursor comprising:
an aluminum-containing substrate, and
a radiation-sensitive imageable layer disposed over the aluminum-containing substrate,
wherein the aluminum-containing substrate comprises:
an aluminum-containing plate having a grained and etched surface;
an inner aluminum oxide layer over the grained and etched surface, the inner aluminum oxide layer having an average dry thickness (TO of at least 500 nm and up to and including 1,500 nm; and comprising a multiplicity of inner pores having an average inner pore diameter ($D_i$) of more than 0 nm but less than 15 nm;
a middle aluminum oxide layer over the inner aluminum oxide layer, the middle aluminum oxide layer having an average dry thickness ($T_m$) of at least 60 nm and up to and including 300 nm; comprising a multiplicity of middle pores having an average middle pore diameter ($D_m$) of at least 15 nm and up to and including 60 nm; and having a middle pore density ($C_m$) of at least 100 middle pores/$\mu m^2$ and up to and including 2,000 middle pores/$m^2$; and
an outer aluminum oxide layer over the middle aluminum oxide layer, the outer aluminum oxide layer having an average dry thickness ($T_o$) of at least 30 nm and up to and including 150 nm; comprising a multiplicity of outer pores having an average outer pore diameter ($D_o$) of at least 5 nm and up to and including 35 nm; and having an outer pore density ($C_o$) of at least 100 outer pores/$\mu m^2$ and up to and including 5,000 outer pores/$m^2$;
wherein the dry thickness of the combination of the middle aluminum oxide layer and the outer aluminum oxide layer is at least 120 nm and up to and including 420 nm,
wherein the ratio of the outer pore density to the middle pore density ($C_o/C_m$) is at least 1.1:1.0, and
wherein $D_m$ is larger than $D_o$ that is larger than $D_i$, and
optionally, a hydrophilic layer comprising one or more hydrophilic polymers provided at a dry coverage of at least 0.0002 g/$m^2$ and up to and including 0.1 g/$m^2$.

9. The lithographic printing plate precursor of claim 8, wherein the ratio of the outer pore density to the middle pore density ($C_o/C_m$) is at least 1.5:1.0.

10. The lithographic printing plate precursor of claim 8, wherein the outer aluminum oxide layer has an average dry thickness ($T_o$) of at least 40 nm and up to and including 140 nm.

11. The lithographic printing plate precursor of claim 8, wherein the middle aluminum oxide layer has an average dry thickness ($T_m$) of at least 70 nm and up to and including 280 nm.

12. The lithographic printing plate precursor of claim 8, further comprising the hydrophilic layer comprising one or more water-soluble polymers.

13. The lithographic printing plate precursor of claim 8, wherein the radiation-sensitive imageable layer is negative-working and comprises:
(a) one or more free radically polymerizable components;
(b) an initiator composition that provides free radicals upon exposure of the radiation-sensitive imageable layer to radiation;
(c) one or more radiation absorbers; and optionally,
(d) a polymeric binder that is different from all of (a), (b), and (c).

14. The lithographic printing plate precursor of claim 13, wherein the radiation-sensitive imageable layer is infrared radiation-sensitive and the one or more radiation absorbers comprise one or more infrared radiation absorbers.

15. The lithographic printing plate precursor of claim 8, wherein the radiation-sensitive layer is negative-working and is on-press developable.

16. The lithographic printing plate precursor of claim 13, wherein the radiation-sensitive layer further comprises the (d) polymeric binder that is in particulate form.

17. The lithographic printing plate precursor of claim 8, wherein:
the grained and etched surface of the aluminum-containing plate has been electrochemically grained and etched;
the radiation-sensitive imageable layer is a negative-working and on-press developable infrared radiation-sensitive imageable layer, and that comprises:
(a) one or more free radically polymerizable components;
(b) an initiator composition that provides free radicals upon exposure of the radiation-sensitive imageable layer to infrared radiation;
(c) one or more infrared radiation absorbers; and
(d) a particulate polymeric binder that is different from all of (a), (b), and (c); and
the hydrophilic layer comprises a polymer comprising recurring units derived from acrylic acid or methacrylic acid, and is present at a dry coverage of at least 0.005 g/$m^2$ and up to and including 0.08 g/$m^2$.

18. A method for providing a lithographic printing plate, comprising:
imagewise exposing the lithographic printing plate precursor of claim 8 to imaging radiation to form an imagewise exposed imageable layer having exposed regions and non-exposed regions, and
removing either the exposed regions or the non-exposed regions, but not both exposed regions and non-exposed regions, from the imagewise exposed imageable layer, to form a lithographic printing plate.

19. The method of claim 18, wherein the non-exposed regions in the imagewise exposed imageable layer are removed on-press using a lithographic printing ink, a fountain solution, or both the lithographic printing ink and the fountain solution.

20. A method for preparing a lithographic printing plate precursor, the method comprising, in order:
A) providing an aluminum-containing plate having an electrochemically or mechanically grained and etched surface;
B) subjecting the aluminum-containing plate to a first anodizing process using phosphoric acid to form an outer aluminum oxide layer over the electrochemically or mechanically grained and etched surface, the outer aluminum oxide layer having an average dry thickness ($T_o$) of at least 30 nm and up to and including 150 nm; comprising a multiplicity of outer pores having an average outer micropore diameter ($D_o$) of at least 5 nm and up to and including 35 nm; and having an outer pore density ($C_o$) of at least 100 outer pores/$\mu m^2$ and up to and including 5,000 outer pores/$\mu m^2$;
C) optionally, rinsing the outer aluminum oxide layer;
D) subjecting the aluminum-containing plate to a second anodizing process using phosphoric acid to form a middle aluminum oxide layer underneath the outer aluminum oxide layer, the middle aluminum oxide layer having an average dry thickness ($T_m$) of at least 60 nm and up to and including 300 nm; comprising a multiplicity of middle pores having an average middle pore diameter ($D_m$) of at least 15 nm and up to and including 60 nm; and having a middle pore density ($C_m$) of at least 100 middle pores/μm$^2$ and up to and including 2,000 middle pores/μm$^2$;

E) optionally, rinsing the middle aluminum oxide layer;

F) subjecting the aluminum-containing plate to a third anodizing process using sulfuric acid to form an inner aluminum oxide layer underneath the middle aluminum oxide layer, the inner aluminum oxide layer having an average dry thickness (TO of at least 500 nm and up to and including 1,500 nm; and comprising a multiplicity of inner pores having an average inner pore diameter ($D_i$) of more than 0 nm but less than 15 nm, to form an aluminum-containing substrate, wherein $D_m$ is larger than $D_o$ that is larger than $D_i$, and wherein the dry thickness of the combination of the middle aluminum oxide layer and the outer aluminum oxide layer is at least 120 nm and up to and including 420 nm;

G) optionally, rinsing the inner aluminum oxide layer;

H) optionally, applying a hydrophilic composition comprising one or more hydrophilic polymers to provide a dry coverage of at least 0.0002 g/m$^2$ and up to and including 0.1 g/m$^2$; and I) disposing a radiation-sensitive imageable layer over the aluminum-containing substrate.

* * * * *